United States Patent [19]

Nagao et al.

[11] Patent Number: 5,438,532
[45] Date of Patent: Aug. 1, 1995

[54] DIGITAL FILTER FOR USE IN SYNTHESIZING FILTER OR A SEPARATION FILTER

[75] Inventors: Fumiaki Nagao; Koji Takano, both of Gifu, Japan

[73] Assignee: Sanyo Electric Co., Ltd., Osaka, Japan

[21] Appl. No.: 183,601

[22] Filed: Jan. 21, 1994

[30] Foreign Application Priority Data

| Jan. 20, 1993 | [JP] | Japan | 5-007604 |
| Jan. 20, 1993 | [JP] | Japan | 5-007605 |
| Nov. 8, 1993 | [JP] | Japan | 5-278697 |

[51] Int. Cl.$^6$ .................................................. G06F 15/31
[52] U.S. Cl. .......................... 364/724.16; 364/724.13; 364/724.17
[58] Field of Search ............... 364/724.16, 724.17, 364/724.13, 724.01

[56] References Cited

U.S. PATENT DOCUMENTS

| 4,117,541 | 9/1978 | Ali | 364/724.17 |
| 4,125,900 | 11/1978 | Betts | 364/724.17 |
| 4,524,423 | 6/1985 | Acampora | 364/724.16 |
| 5,040,137 | 8/1991 | Sherrill | 364/724.16 |
| 5,319,584 | 6/1994 | Ooyabu | 364/724.13 |

OTHER PUBLICATIONS

Galand, "New Quadrature Mirror Filter Structures", pp. 522–531, 1984, *IEEE Trans. Acoust., Speech, Signal Processing*, vol. Assp-32, No. 3, Jun., 1984.

*Primary Examiner*—David H. Malzahn
*Attorney, Agent, or Firm*—Sheridan Ross & McIntosh

[57] ABSTRACT

A separation filter has a memory for storing sequential input data. A multiplier multiplies sequential input data, read from the memory, by a predetermined filter coefficient. An accumulator sequentially accumulates the multiplication result from the multiplier. A pair of registers alternately receive the accumulation result from the accumulator. An adder/subtracter adds or subtracts two accumulation results, obtained from the register pair, together or one from the other, and outputs the operation result as two pieces of sequential output data which are the sequential input data separated. In a synthesizing filter, an adder/subtracter adds or subtracts two pieces of sequential input data together or one from the other, a memory stores the operation result from the adder/subtracter, a multiplier multiplies the operation result, read from the memory, by a predetermined filter coefficient, and an accumulator sequentially accumulates the multiplication result from the multiplier, and outputs the accumulation result as sequential output data which is the two pieces of sequential input data synthesized.

10 Claims, 21 Drawing Sheets

Fig. 2

| | | | |
|---|---|---|---|
| x(n) | | x(8) | x(9) | | | x(10) |
| Written data in RAM31 | | x(8) | | x(9) | |
| Read data from RAM31 | x(8) | x(6) | x(4) | x(2) | x(7) | x(5) | x(3) | x(1) | |
| Read data from ROM32 | h(0) | h(2) | h(4) | h(6) | h(1) | h(3) | h(5) | h(7) | |
| Register36 | A1 | A2 | A3 | A4 | B1 | B2 | B3 | B4 | |
| Register37 | | | | A4 | | | | | |
| Register38 | | | | | | | | B4 | |
| Register40 | | | | | | | | y_b(4) | y_a(4) |

Fig. 6

| Row | Timeline values |
|---|---|
| x(n) | x(8) \| x(9) \| x(10) |
| Written data in RAM31 | x(8) \| \| \| z(4) \| \| \| x(9) |
| Read data from RAM31 | x(8) \| x(6) \| x(7) \| x(5) \| z(4) \| z(2) \| z(3) \| z(1) \| x(9) \| x(7) \| x(8) |
| Read data from ROM32 | h(0) \| h(2) \| h(1) \| h(3) \| h(0) \| h(2) \| h(1) \| h(3) \| h(0) \| h(2) \| h(1) |
| Register 36 | A1 \| A2 \| B1 \| B2 \| C1 \| C2 \| D1 \| D2 \| A1 \| A2 |
| Register 37 | A2 \| \| C2 |
| Register 38 | B2 \| \| D2 |
| Register 40 | $y_c(4)$ \| \| $y_b(2)$ \| $y_a(2)$ |

Fig.9

| | | | | | | | | | |
|---|---|---|---|---|---|---|---|---|---|
| x(n) | | | x(8) | x(9) | | | | | x(10) |
| Written data in RAM31 | | | x(8) | | | y_c(4) | z(4) | x(9) | |
| Read data from RAM31 | | x(8) | x(6) | x(7) | x(5) | y_c(2) | z(4) z(2) z(3) z(1) | x(9) x(7) x(8) | |
| Read data from ROM32 | | h(0) | h(2) | h(1) | h(3) | | h(0) h(2) h(1) h(3) | h(0) h(2) h(1) | |
| Register36 | | | A1 | A2 | B1 | B2 | C1 C2 D1 D2 | A1 A2 | |
| Register37 | | | | | A2 | | C2 | | | |
| Register38 | | | | | | B2 | | D2 | | |
| Register40 | | | | | | y_c(2) | | y_b(2) y_a(2) | | |

Fig. 17

| Signal | Values |
|---|---|
| $x_a(n)$ | $x_a(1)$ |
| $x_b(n)$ | $x_b(1)$ |
| $x_c(n)$ | $x_c(1)$ |
| $x_d(n)$ | $x_d(1)$ |
| Written data in RAM31 | $x_a(1)-x_b(1)$, $x_a(1)+x_b(1)$, $x_c(1)-x_d(1)$, $x_c(1)+x_d(1)$, $z_a(2)-z_b(2)$, $z_a(2)+z_b(2)$ |
| Read data from RAM31 | $x_a(0)-x_b(0)$, $x_c(0)-x_d(0)$, $z_a(2)-z_b(2)$, $z_a(1)-z_b(1)$ |
| Read data from ROM32 | $h(0), h(2)$, $h(0), h(2)$, $h(0), h(2)$, $h(0), h(1)$ |
| Register 27 | $z_a(2)$ — A2 {$z_a(2)$} |
| Register 36 | 0, A1, 0, B1, 0, C1, 0 — B2 {$z_b(2)$}, C2 {y(4)} |
| Register 12 | y(4) |

DIGITAL FILTER FOR USE IN SYNTHESIZING FILTER OR A SEPARATION FILTER

BACKGROUND OF THE INVENTION

1. Field of the Invention

The present invention relates to a digital filter for use in a digital audio equipment or the like, and more particularly to a synthesizing filter or a separation filter which uses a QMF (Quadrature Mirror Filter).

2. Description of the Related Art

Recently, digital audio equipment has enjoyed increasing popularity with the consuming public, due in part to digital filter technology's remarkably clear and crisp audio sound. This type of technology is typified by the increasingly common compact disk player. An analog filter handles analog signals, whereas a digital filter handles digital signals. One great advantage that digital filters have over analog filters is that the filter characteristics of the digital filter are easily modified. This is especially helpful where complicated filtering is required, since the digital filter's filtering characteristics will not easily vary due to changes in the filter's external surroundings or due to effects caused by the passage of time.

Digital filters are classified into an FIR (Finite Impulse Response) filters and IIR (Infinite Impulse Response) filters.

Since the FIR filter computes sequential output data using only old sequential input data, the influence of the sequential input data's determined impulse response on sequential output data is limited to finite time. Since the IIR filter feeds old sequential output data back to the input side and treats this data as new sequential input data to compute sequential output data, the influence of the impulse response of the sequential input data on the sequential output data extends to infinite time. The FIR filter and IIR filter are used for the same purpose. Although the IIR filter has higher performance, the design is difficult and the structure is complicated. In this respect, the FIR filter is used more widely.

The FIR filter is designed in such a way as to obtain sequential output data y(n) through convolution of the sequential input data x(n) and the impulse response, as apparent from an equation (1) where h(k) is a filter coefficient (weighting function) and N is the number of taps being considered.

$$y(n) = \sum_{k=0}^{N-1} h(k)x(n-k) \quad (1)$$

Performing a Z transform of the equation (1) yields an equation (2). An equation (3) is derived as the complex frequency response from the equation (2), with the frequency response being further derived in equation (3).

$$H(z) = \sum_{n=0}^{N-1} h(n)z^{-n} \quad (2)$$

$$H(e^{j\omega}) = \sum_{n=0}^{N-1} h(n)e^{-j\omega n} \quad (3)$$

Substituting $\omega = 2\pi k/N$ in the equation (3) yields an equation (4).

$$H(e^{j\omega}) = \sum_{n=0}^{N-1} h(n)e^{-j2\pi nk/N} \quad (4)$$

The equation (4) can be considered as an equation for discrete Fourier transform (DFT). Thus, the filter coefficient h(k) is obtained by inverse discrete Fourier transform (IDFT) of the frequency response given by the equation (4).

The block diagram illustrated in FIG. 18 shows the structure of a typical FIR filter.

A plurality of delay elements 101, connected in series, are each constituted by a shift register and sequentially delay the sequential input data x(n) by a given time (T). Each of a plurality of multipliers 102, connected to the outputs of the respective delay elements 101, multiplies the output of the associated delay element 101 by a filter coefficient h(k). Accordingly, convolution of the sequential input data x(n) and the impulse response is performed. A total adder 103 obtains the sum of the outputs of the individual multipliers 102 (the outputs of the individual delay elements 101 each multiplied by a predetermined filter coefficient h(k)), and outputs the sum as sequential output data y(n). This operation corresponds to a solution of the convolution expressed in equation (1).

The FIR filter shown in FIG. 18, however, has a shortcoming that the circuit scale increases with an increase in the number of taps N.

As a solution to this problem, a stored program type FIR filter as shown in FIG. 19 has been proposed.

A RAM (Random Access Memory) 111 stores sequential input data x(n) in the order with which they are input. A ROM (Read Only Memory) 112 holds a plurality of filter coefficients h(k). When accessed, the ROM 112 outputs a specific filter coefficient h(k) in accordance with the value of k which increases every step. It is to be noted that k is the same as k in the equation (1). A multiplier 113 multiplies the sequential input data x(n−k), read from the RAM 111, by the filter coefficient h(k), read from the ROM 112. An accumulator 114, which comprises an adder 115 and a register 116, accumulates the result of the multiplication done by the multiplier 113. That is, the adder 115 adds the output of the multiplier 113 and the output of the register 116, and stores the addition result again in the register 116, thereby sequentially accumulating the multiplication result from the multiplier 113. A register 117 receives the accumulation result output from the accumulator 114, and outputs it as sequential output data y(n).

The stored program type FIR filter shown in FIG. 19 reads the sequential input data x(n) and the filter coefficient h(k) respectively from the RAM 111 and ROM 112 in order, and repeatedly performs a multiplication and addition operation to derive a product and sum, corresponding to the sequential output data y(n) represented by equation (1). With this type of filter, even if the number of taps N increases, the circuit scale will not increase.

Incidentally, from the frequency response, an FIR filter with a filter coefficient h2(n), which satisfies an equation (5), is called a mirror filter to an FIR filter with a filter coefficient h1(n).

$$h_2(n) = (-1)^n h_1(n) \quad (5)$$

The relation of Z transform of the mirror filter is given by an equation (6).

$$H_2(z) = \sum_{n=-\infty}^{\infty} z^{-n} h_2(n)$$
$$= \sum_{n=-\infty}^{\infty} z^{-n}(-1)^n h_1(n)$$
$$= H_1(-z) \tag{6}$$

When the frequency response is considered, an equation (8) can be derived from an equation (7).

$$h_2(n) = e^{j\pi n} h_1(n) \tag{7}$$

$$H_2(e^{j\omega}) = H_1(e^{\omega+\pi}) \tag{8}$$

It is understood from the equation (8) that the frequency response of the mirror filter is $\pi/2$ and is consequently symmetrical. As $\pi/2$ is $\frac{1}{4}$ of the sampling frequency, this mirror filter is called quadrature mirror filter (QMF). The details of this QMF are given in IEEE TRANSACTIONS ON ACOUSTICS, SPEECH, AND SIGNAL PROCESSING, VOL. ASSP-32, NO. 3, JUNE 1984, pp. 522–531.

QMFs are classified to a separation filter and a synthesizing filter.

The separation filter separates one piece of sequential input data to plural pieces of sequential output data, and splits the frequency component to subbands. The synthesizing filter synthesizes plural pieces of sequential input data into a single piece of sequential output data, i.e., synthesizes the frequency components in a plurality of subbands into a single frequency component.

The separation filter is designed in such a way as to provide two sequential output data $y_a(n)$ and $y_b(n)$, which are sequential input data x(n) separated by a convolution of the sequential input data x(n) and the impulse response and by the addition of those two or subtraction of one from the other, as apparent from equations (9) and (10).

$$y_a(n) = \sum_{k=N-1}^{0} h(2k) \cdot x(2n - 2k) - \sum_{k=n-1}^{0} h(2k + 1) \cdot x(2n - 2k - 1) \tag{9}$$

$$y_b(n) = \sum_{k=N-1}^{0} h(2k) \cdot x(2n - 2k) + \sum_{k=n-1}^{0} h(2k + 1) \cdot x(2n - 2k - 1) \tag{10}$$

FIG. 20 shows the structure of a typical separation filter.

A plurality of delay elements 121, connected in series, sequentially delay the sequential input data x(n) by a given time (T). Each of multipliers 122, connected to the outputs of those delay elements 121 at even-numbered stages, multiplies the output of the associated delay element 121 by a filter coefficient h(2k) and sends the result to a total adder 123. Each of multipliers 124, connected to the outputs of those delay elements 121 at odd-numbered stages, multiplies the output of the associated delay element 121 by a filter coefficient h(2k+1) and sends the result to a total adder 125. Accordingly, convolution of the sequential input data x(n) and the impulse response is performed. The total adder 123 obtains the sum of the outputs of the individual multipliers 122 (the outputs of the individual delay elements 121 each multiplied by a predetermined filter coefficient h(2k)), and outputs the sum as data An. The total adder 125 obtains the sum of the outputs of the individual multipliers 124 (the outputs of the individual delay elements 121 each multiplied by a predetermined filter coefficient h(2k+1)), and outputs the sum as data Bn. A subtracter 126 subtracts the data Bn, output from the total adder 125, from the data An, output from the total adder 123, and outputs the result as sequential output data $y_a(n)$. An adder 127 adds the data An from the total adder 123 and the data Bn from the total adder 125 together, and outputs the result as sequential output data $y_b(n)$.

The separation filter shown in FIG. 20, however, has a shortcoming that the circuit scale increases with an increase in the number of taps N. Particularly, in separating one piece of sequential input data to three or more pieces of sequential output data, the above-described separation filter should be multiplexed, thus further increasing the circuit scale.

The synthesizing filter is designed in such a way as to provide sequential output data y(2n) and y(2n+1), which are two pieces of sequential input data $x_a(n)$ and $x_b(n)$ synthesized, through convolution of those sequential input data $x_a(n)$ and $x_b(n)$ and the impulse response and their addition or subtraction, as apparent from equations (11) and (12).

$$y(2n) = \sum_{k=0}^{N-1} h(2k) \{x_a(n - k) - x_b(n - k)\} \tag{11}$$

$$y(2n + 1) = \sum_{k=0}^{N-1} h(2k + 1) \{x_a(n - k) + x_b(n - k)\} \tag{12}$$

FIG. 21 shows the structure of a typical synthesizing filter 130.

A subtracter 131 subtracts the sequential input data $x_b(n)$ from the sequential input data $x_a(n)$. An adder 132 adds the sequential input data $x_b(n)$ and the sequential input data $x_a(n)$ together. A switch 133 alternately switches between the output of the subtracter 131 and the output of the adder 132, and outputs the selected output to series-connected delay elements 121. Then, the convolution of the result of the subtraction of the sequential input data $x_b(n)$ from the sequential input data $x_a(n)$, the result of the addition of $x_a(n)$ and $x_b(n)$ and the impulse response is executed by multipliers 122 and 124 and total adders 123 and 125, which are designed in the same way as those of the separation filter shown in FIG. 20. The switch 134 performs alternate switching between the outputs of the total adders 123 and 125 in synchronism with the switch 133, and outputs the selected output as sequential output data y(2n) or y(2n+1).

The synthesizing filter 130 shown in FIG. 21, however, has a shortcoming that the circuit scale increases with an increase in the number of taps N. Particularly, in synthesizing three or more pieces of sequential input data into one piece of sequential output data, the synthesizing filter 130 shown in FIG. 21 should be multiplexed, thus further increasing the circuit scale.

For instance, in synthesizing three pieces of sequential input data $x_a(n)$, $x_b(n)$ and $x_c(n)$, first, two pieces of sequential input data $x_a(n)$ and $x_b(n)$ are synthesized by a synthesizing filter $130\alpha$, yielding data $z(2n)$ and $z(2n+1)$, as shown in FIG. 22. Then, the data $z(2n)$ and $z(2n+1)$ and the sequential input data $x_c(n)$ are synthesized by a synthesizing filter $130\beta$, yielding sequential output data $y(4n)$ and $y(4n+1)$. It is apparent that synthesizing three pieces of sequential input data requires two synthesizing filters 130.

There may be a case where three pieces of sequential input data $x_a(n)$, $x_b(n)$ and $x_c(n)$ are sent in parallel, and the sequential input data $x_c(n)$ is input to the synthesizing filter $130\beta$ with a delay corresponding to the processing time of the synthesizing filter $130\alpha$. In this case, a delay circuit 40 should be provided separately from the two synthesizing filters $130\alpha$ and $130\beta$, so that the sequential input data $x_c(n)$ will be input via this delay circuit 140 to the synthesizing filter $130\beta$, as shown in FIG. 23. This design undesirably increases the circuit scale by the delay circuit 140.

In synthesizing four pieces of sequential input data $x_a(n)$, $x_b(n)$, $x_c(n)$ and $x_d(n)$, first, two pieces of sequential input data $x_a(n)$ and $x_b(n)$ are synthesized by a synthesizing filter $130\alpha$, yielding data $z_a(2n)$ and $z_a(2n+1)$, as shown in FIG. 24. At the same time, two pieces of sequential input data $x_c(n)$ and $x_d(n)$ are synthesized by a synthesizing filter $130\gamma$, yielding data $z_b(2n)$ and $z_b(2n+1)$. Then, the data $z_a(2n)$, $z_a(2n+1)$, $z_b(2n)$ and $z_b(2n+1)$ are synthesized by a synthesizing filter $130\beta$, yielding sequential output data $y(4n)$ and $y(4n+1)$. Thus, when four pieces of sequential input data are synthesized, three synthesizing filters 130 are required.

As is apparent from the above, synthesizing of three or more pieces of sequential input data needs a plurality of synthesizing filters 130 for the multiplexing purpose, thus significantly increasing the overall circuit scale.

SUMMARY OF THE INVENTION

It is therefore an objective of the present invention to provide a separation filter or a synthesizing filter, which will not increase the circuit scale even when the number of taps increases.

It is another objective of this invention to provide a digital filter which will separate or synthesize three or more pieces of sequential input data without increasing the circuit scale.

To achieve the above objectives, a separation filter embodying this invention has a memory for storing sequential input data. A multiplier multiplies sequential input data, read from the memory, by a predetermined filter coefficient. An accumulator sequentially accumulates the multiplication result from the multiplier. A pair of registers alternately receive the accumulation result from the accumulator. An adder/subtracter adds or subtracts two accumulation results, obtained from the register pair together, together or one from the other, and outputs the operation result as two pieces of sequential output data which are the sequential input data separated.

In a synthesizing filter embodying this invention, an adder/subtracter adds or subtracts two pieces of sequential input data together or one from the other. A memory stores the operation result from the adder/subtracter. A multiplier multiplies the operation result, read from the memory, by a predetermined filter coefficient. An accumulator sequentially accumulates the multiplication result from the multiplier, and outputs the accumulation result as sequential output data which is the two pieces of sequential input data synthesized.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

FIG. 2 is a timing chart for explaining the operation of the first embodiment;

FIG. 6 is a timing chart for explaining the operation of the second embodiment;

FIG. 9 is a timing chart for explaining the operation of the third embodiment;

FIG. 17 is a timing chart for explaining the operation of the seventh embodiment;

DETAILED DESCRIPTION OF THE PREFERRED EMBODIMENTS

First Embodiment

Figure 1:
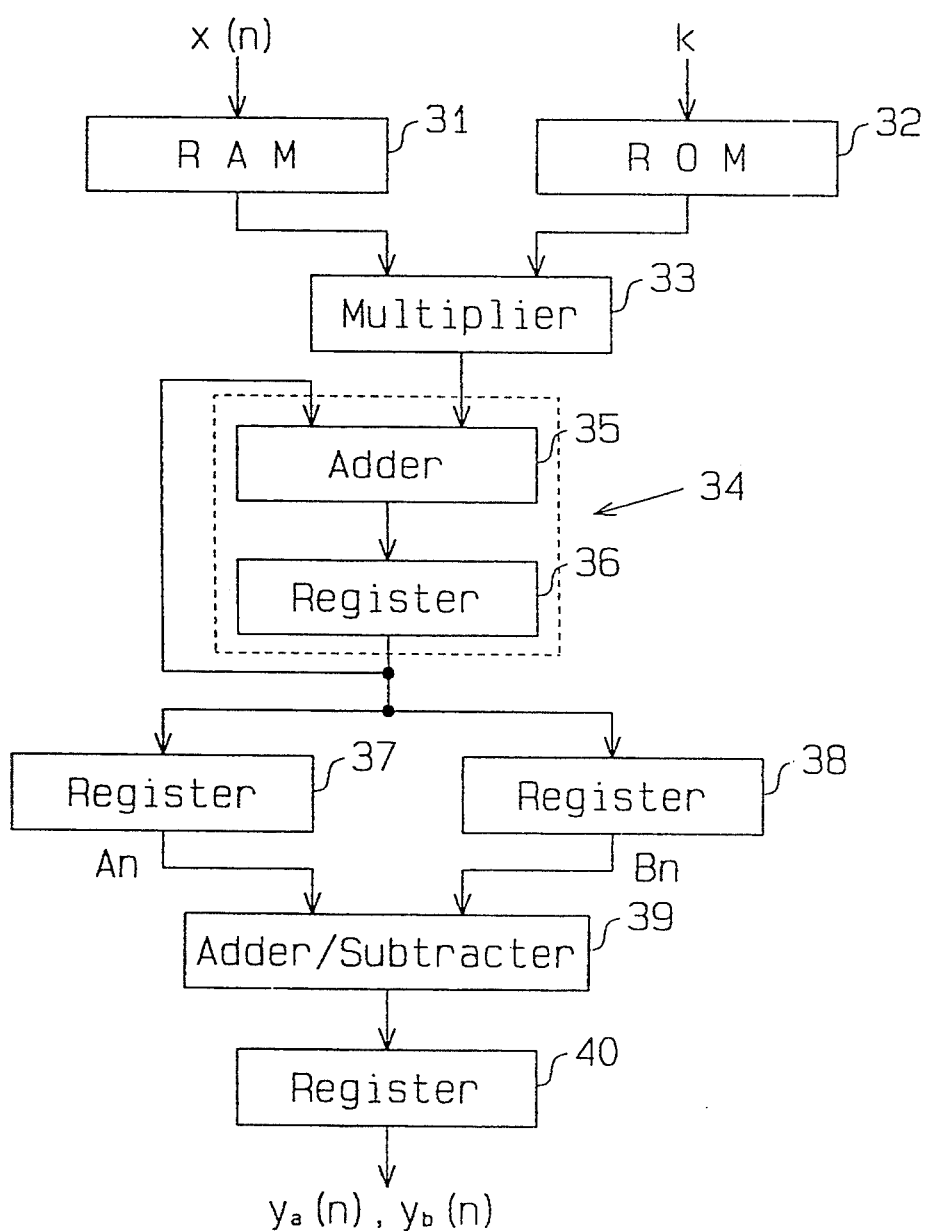
FIG. 1 is a block circuit diagram of a separation filter according to a first embodiment of the present invention.

FIG. 1 shows the structure of a separation filter according to this embodiment.

A RAM 31 stores sequential input data x(n) in order. A ROM 32 is holding a plurality of filter coefficients h(k). When accessed, the ROM 32 outputs a specific filter coefficient h(k) in accordance with the value of k which increases every step. It is to be noted that k is the same as k in the equations (9) and (10). A multiplier 33 multiplies the sequential input data x(n−k), read from the RAM 31, by the filter coefficient h(k), read from the ROM 32. An accumulator 34, which comprises an adder 35 and a register 36, accumulates the result of the multiplication done by the multiplier 33. That is, the adder 35 adds the output of the multiplier 33 and the output of the register 36, and stores the addition result again in the register 36, thereby sequentially accumulating the multiplication result from the multiplier 33. Registers 37 and 38 alternately receive the accumulation result output from the accumulator 34, and output at a given timing. For instance, the register 37 receives an accumulation result An, which is an odd-numbered output of the accumulator 34, and the register 38 receives an accumulation result Bn, which is an even-numbered output of the accumulator 34. An adder/subtracter 39 subtracts the accumulation results An and Bn, held in the two registers 37 and 38, one from the other and adds the accumulation results together. A register 40 receives the subtraction result (An−Bn) and the addition result (An+Bn) from the adder/subtracter 39, and outputs them as sequential output data $y_a(n)$ and $y_b(n)$, respectively.

The operation of the separation filter according to this embodiment will now be described with reference to the timing chart given in FIG. 2. It is to be noted that the number of taps N is set to "4".

Substitution of the number of taps N=4 in the equations (9) and (10) yields equations (13) and (14).

$$\begin{aligned} y_a(n) = & \; h(6) \cdot x - (2n-6) + h(4) \cdot x(2n-4) + \\ & h(2) \cdot x(2n-2) + h(0) \cdot x(2n) - \\ & h(7) \cdot x(2n-7) - h(5) \cdot x(2n-5) - \\ & h(3) \cdot x(2n-3) - h(1) \cdot x(2n-1) \end{aligned} \quad (13)$$

$$\begin{aligned} y_b(n) = & \; h(6) \cdot x(2n-6) + h(4) \cdot x(2n-4) + \\ & h(2) \cdot x(2n-2) + h(0) \cdot x(2n) + \\ & h(7) \cdot x(2n-7) + h(5) \cdot x(2n-5) + \\ & h(3) \cdot x(2n-3) + h(1) \cdot x(2n-1) \end{aligned} \quad (14)$$

Although the inputting of sequential input data x(0) to x(7) is omitted in FIG. 2, those pieces of sequential input data are also input and written in the RAM 31 in the same manner as the sequential input data x(8) and x(9).

With n=4, first, sequential input data x(8) is read out from the RAM 31, and a filter coefficient h(0) is read out from the ROM 32 in association with the input data. The multiplier 33 multiplies the sequential input data x(8) by the filter coefficient h(0), and supplies the multiplication result to the accumulator 34. At this time, the data in the accumulator 34 has been cleared, and data A1 given by an equation (15) is held directly in the register 36. Next, sequential input data x(6), x(4) and x(2) are sequentially read out from the RAM 31, and filter coefficients h(2), h(4) and h(6) are sequentially read out from the ROM 32 in association with the input data. The multiplier 33 multiplies those pieces of sequential input data by the respective filter coefficients, and supplies the multiplication results to the accumulator 34. The accumulator 34 accumulates the received multiplication results, and data A2 to A4 given by equations (16) to (18) are held in the register 36 in order. The last-stored data A4, given by the equation (18), is output from the accumulator 34 and is held in the register 37.

$$A1 = h(0) \cdot x(8) \quad (15)$$

$$A2 = h(2) \cdot x(6) + A1 \quad (16)$$

$$A3 = h(4) \cdot x(4) + A2 \quad (17)$$

$$\begin{aligned} A4 = & \; h(6) \cdot x(2) + A3 \\ = & \; h(0) \cdot x(8) + h(2) \cdot x(6) + \\ & h(4) \cdot x(4) + h(6) \cdot x(2) \end{aligned} \quad (18)$$

Similarly, sequential input data x(7) is read out from the RAM 31, and a filter coefficient h(1) is read out from the ROM 32 in association with the input data. The multiplier 33 multiplies the sequential input data x(7) by the filter coefficient h(1), and supplies the multiplication result to the accumulator 34. At this time, the data in the accumulator 34 has been cleared, and data B1 given by an equation (19) is held directly in the register 36. Subsequently, sequential input data x(5), x(3) and x(1) are sequentially read out from the RAM 31, and filter coefficients h(3), h(5) and h(7) are sequentially read out from the ROM 32 in association with the input data. The multiplier 33 multiplies those pieces of sequential input data by the respective filter coefficients, and supplies the multiplication results to the accumulator 34. The accumulator 34 accumulates the received multiplication results, and data B2 to B4 given by equations (20) to (22) are held in the register 36 in order. The last-stored data B4, given by the equation (22), is output from the accumulator 34 and is held in the register 38.

$$B1 = h(1) \cdot x(7) \quad (19)$$

$$B2 = h(3) \cdot x(5) + B1 \quad (20)$$

$$B3 = h(5) \cdot x(3) + B2 \quad (21)$$

$$\begin{aligned} B4 = & \; h(7) \cdot x(1) + B3 \\ = & \; h(1) \cdot x(7) + h(3) \cdot x(5) + \\ & h(5) \cdot x(3) + h(7) \cdot x(1) \end{aligned} \quad (22)$$

Then, the data A4 and data B4 are input to the adder/subtracter 39 respectively from the registers 37 and 38. The adder/subtracter 39 adds the received data A4 and B4 together, and then subtracts the data B4 from the data A4. The operation results from the adder/subtracter 39 are held in the register 40. The addition result given by an equation (23) is output as sequential output data $y_b(4)$, and the subtraction result given by an equation (24) is output as sequential output data $y_a(4)$.

$$\begin{aligned} A4 + B4 = & \; h(6) \cdot x(2) + h(4) \cdot x(4) + h(2) \cdot x(6) + \\ & h(0) \cdot x(8) + h(7) \cdot x(1) - h(5) \cdot x(3) + \\ & h(3) \cdot x(5) + h(1) \cdot x(7) \end{aligned} \quad (23)$$

$$A4 - B4 = h(6) \cdot x(2) + h(4) \cdot x(4) + h(2) \cdot x(6) + h(0) \cdot x(8) - h(7) \cdot x(1) - h(5) \cdot x(3) - h(3) \cdot x(5) - h(1) \cdot x(7) \quad (24)$$

As a result, the operations expressed by the equations (13) and (14) have been executed.

Figure 3:
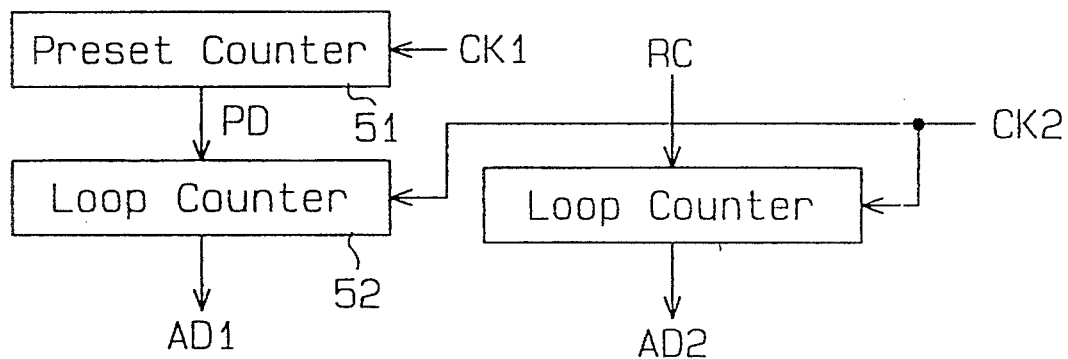
FIG. 3 is a block circuit diagram of an address generator.

Addresses which are given to the RAM 31 and ROM 32 are generated by an address generator shown in FIG. 3.

A preset counter 51 counts up in response to a clock CK1 whose period matches with a series of operational cycles of the accumulator 34, and generates preset data PD which is incremented every time the accumulation of the accumulator 34 is complete. A loop counter 52 counts up in response to a clock CK2 whose period matches with the operation cycle of the multiplier 33, and generates address data AD1 which is incremented every time the multiplication of the multiplier 33 is complete. The address data AD1 specifies an address in the RAM 31 to read out predetermined sequential input data x(n). A loop counter 53 is reset by a reset clock RC, whose period matches with that of the clock CK1. Then, the loop counter 53 counts up in response to the clock CK2, and generates address data AD2 which is incremented every time the multiplication of the multiplier 33 is complete. The address data AD2 specifies an address in the ROM 32 to read out a predetermined filter coefficient h(n). Accordingly, the address data AD1 supplied to the RAM 31 is incremented by one every time the accumulator 34 completes the accumulation, while the address data AD2 supplied to the ROM 32 provides the same address repeatedly every time the accumulator 34 completes the accumulation. Thus, the same filter coefficient h(n) is repeatedly read out from the ROM 32, and sequential input data x(n) is read out from the RAM 31 piece by piece.

In the separation filter of this embodiment, as described above, the multiplier 33 repeats the multiplication of the sequential input data x(n) and filter coefficient h(n), and the multiplication result is accumulated by the accumulator 34. Accordingly, the operations according to the equations (13) and (14) are executed, yielding two pieces of sequential output data $y_a(n)$ and $y_b(n)$ which are separated from the sequential input data x(n). According to this embodiment, therefore, the circuit scale will not increase even if the number of taps N increases.

Second Embodiment

A description will now be given of the case where one piece of sequential input data is separated into three pieces of sequential output data.

Figure 20:
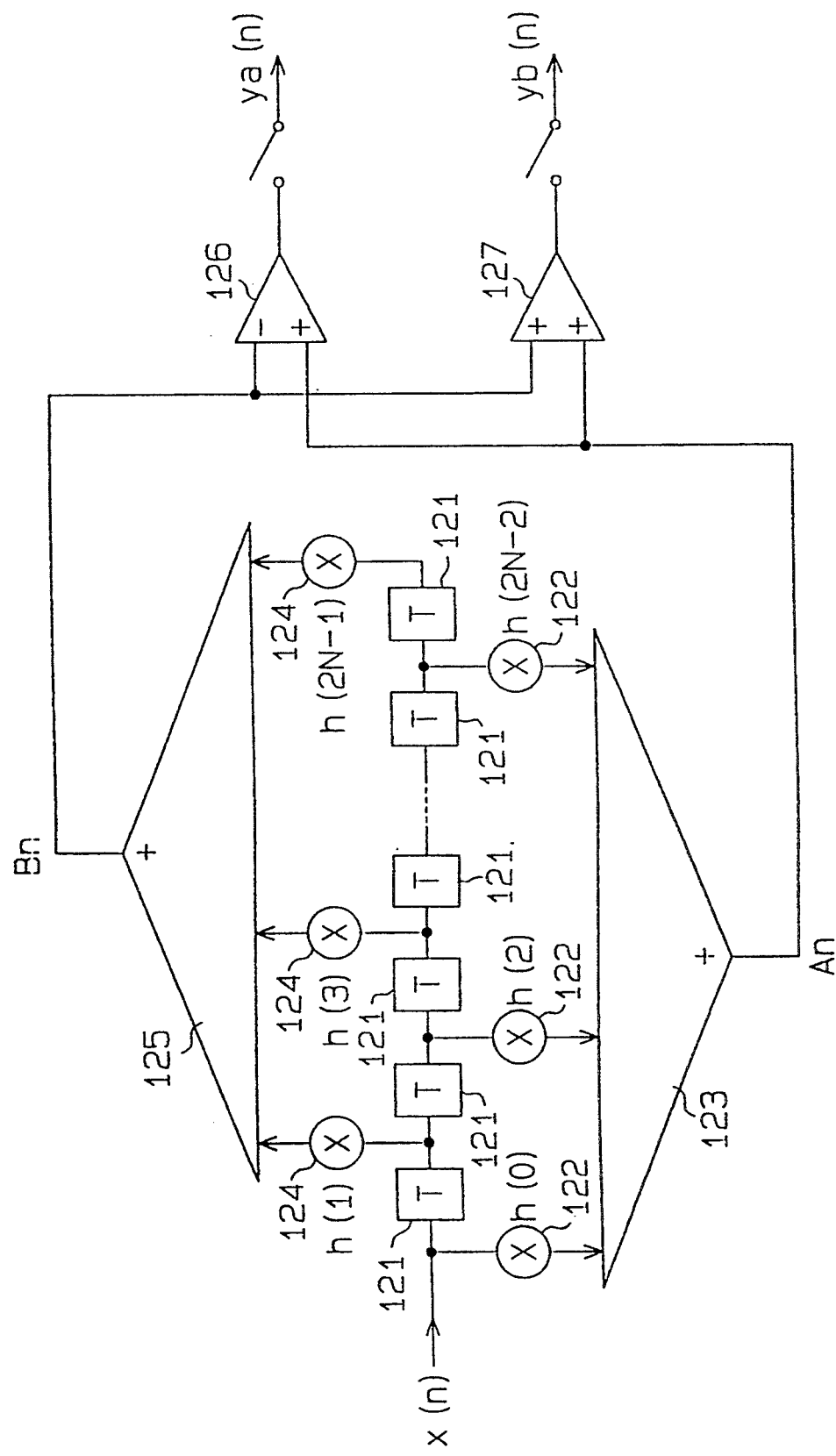
FIG. 20 is a block circuit diagram of a conventional separation filter.
Figure 21:
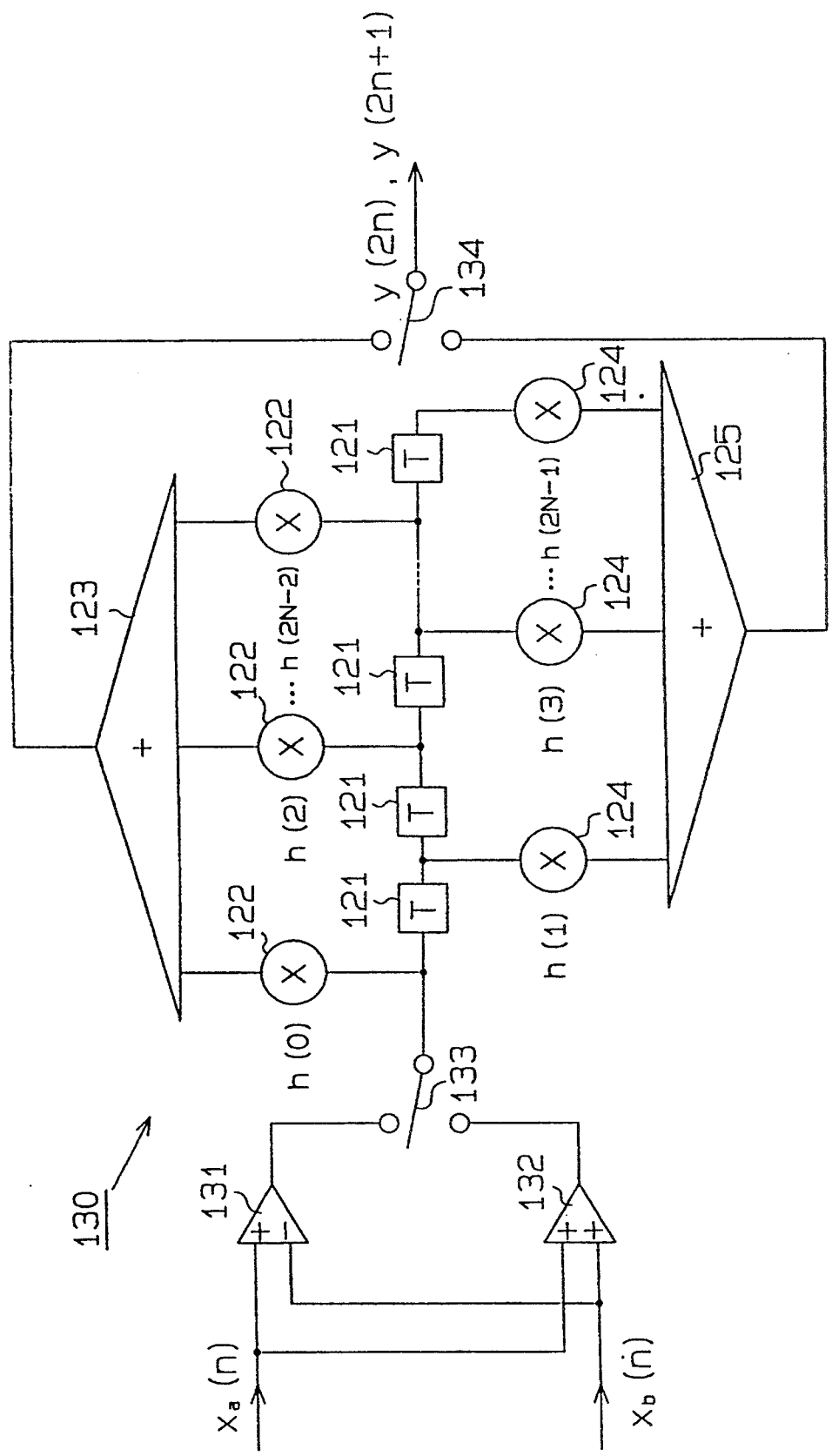
FIG. 21 is a block circuit diagram of a conventional synthesizing filter.

Conventionally, in separating one piece of sequential input data x(n) to three sequential output data $y_a(n)$, $y_b(n)$ and $y_c(n)$, two separation filters as shown in FIG. 20 are used to perform a separating process twice, i.e., the separation filters are arranged in a multiplexing manner. For example, one of two pieces of sequential output data $y_c(n)$ and z(n) from a separation filter 61, which receives sequential input data x(n), is sequential input data to another separation filter 62, so that three pieces of sequential output data $y_a(n)$, $y_b(n)$ and $y_c(n)$ are finally obtained. The conventional design therefore requires two separation filters 61 and 62, increasing the general circuit scale.

In this case, in accordance with the equations (9) and (10), operations expressed by equations (25) and (26) are performed on the sequential input data x(n) first.

$$z(n) = \sum_{k=N-1}^{0} h(2k) \cdot x(2n - 2k) - \quad (25)$$

$$\sum_{k=N-1}^{0} h(2k + 1) \cdot x(2n - 2k - 1)$$

$$y_c(n) = \sum_{k=N-1}^{0} h(2k) \cdot x(2n - 2k) + \quad (26)$$

$$\sum_{k=N-1}^{0} h(2k + 1) \cdot x(2n - 2k - 1)$$

Then, operations expressed by equations (27) and (28) are performed on the sequential output data z(n).

$$y_a(n) = \sum_{k=N-1}^{0} h(2k) \cdot z(2n - 2k) - \quad (27)$$

$$\sum_{k=N-1}^{0} h(2k + 1) \cdot z(2n - 2k - 1)$$

$$y_b(n) = \sum_{k=N-1}^{0} h(2k) \cdot z(2n - 2k) + \quad (28)$$

$$\sum_{k=N-1}^{0} h(2k + 1) \cdot z(2n - 2k - 1)$$

Figure 4:
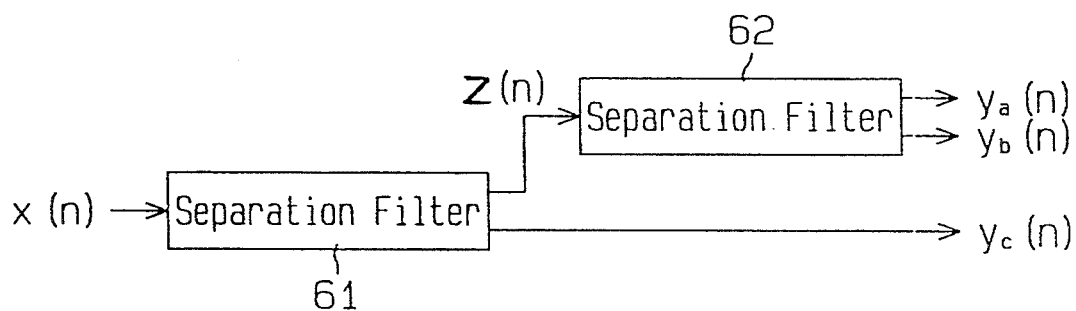
FIG. 4 is a block circuit diagram showing a structure having multiplexed separation filters.
Figure 5:
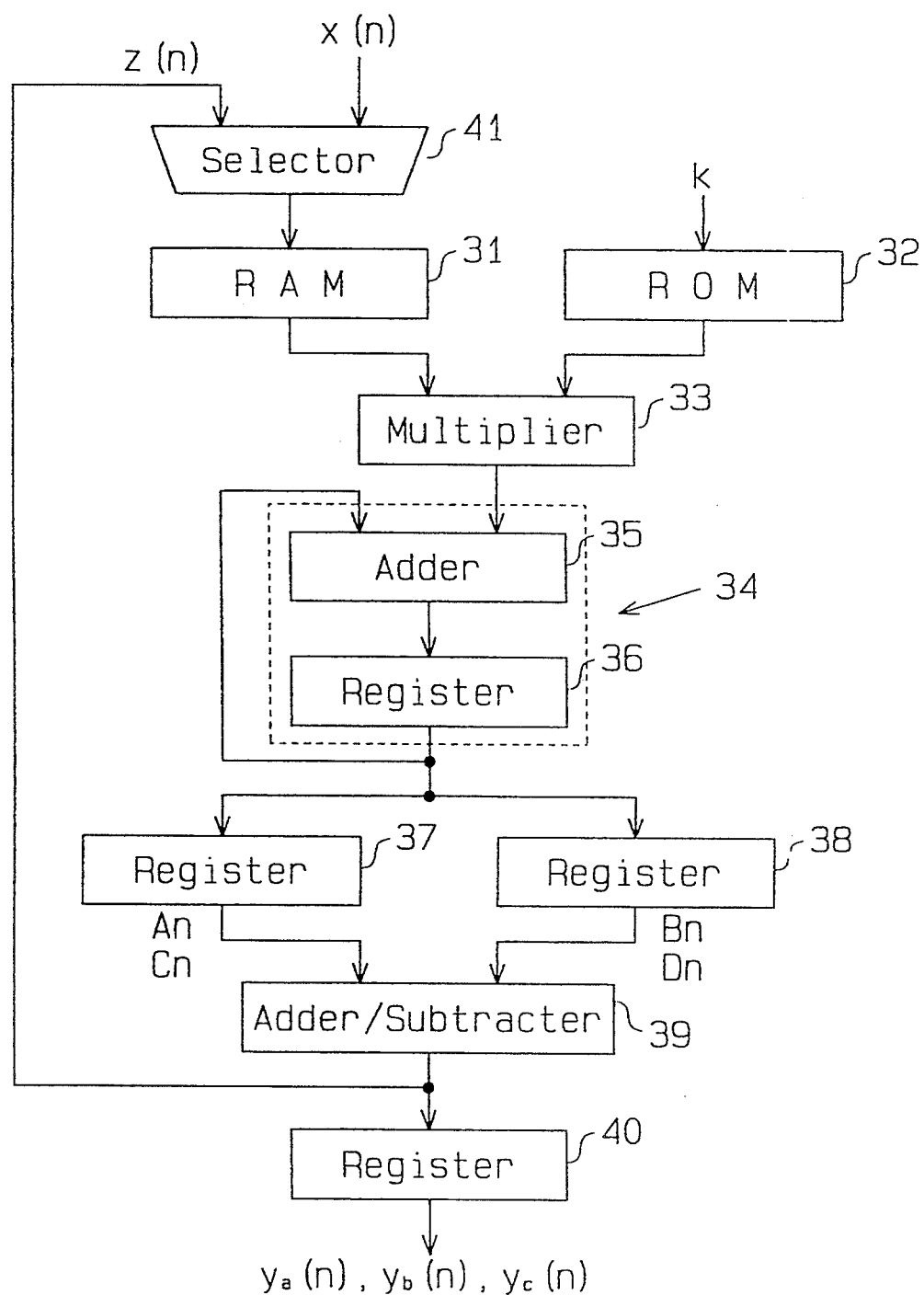
FIG. 5 is a block circuit diagram of a separation filter according to a second embodiment of this invention.

However, the separation filter of the first embodiment, shown in FIG. 5, can perform the same operation as performed by the multiplexed structure having the two separation filters 61 and shown in FIG. 4.

FIG. 5 shows the structure of the separation filter according to the second embodiment.

The selector 41 is provided on the input side of the RAM to switch between sequential input data x(n) and sequential output data z(n), which is output from the adder/subtracter 39, and write the selected data in the RAM 31, so that the sequential output data z(n) will be treated again as sequential input data. Therefore, two pieces of sequential output data $y_c(n)$ and z(n) are obtained through the first operation on the sequential input data x(n), and two more pieces of sequential output data $y_a(n)$ and $y_b(n)$ are obtained through the second operation on that output data z(n).

The operation of the separation filter according to this embodiment will now be described with reference to the timing chart given in FIG. 6. It is to be noted that the number of taps N is set to "2".

Substitution of the number of taps N=2 in the equations (25) and (26) yields equations (29) and (30). Here, m=2n (when m is an even number) or m=2n−1 (when m is an odd number).

$$z(m) = h(2) \cdot x(2m-2) + h(0) \cdot x(2m) - h(3) \cdot x(2m-3) - h(1) \cdot x(2m-1) \quad (29)$$

$$y_c(m) = h(2) \cdot x(2m-2) + h(0) \cdot x(2m) + h(3) \cdot x(2m-3) + h(1) \cdot x(2m-1) \quad (30)$$

Substitution of the number of taps N=2 in the equations (27) and (28) yields equations (31) and (32).

$$y_a(n) = h(2) \cdot z(2n-2) + h(0) \cdot z(2n) - h(3) \cdot z(2n-3) - h(1) \cdot z(2n-1) \quad (31)$$

$$y_b(n)=h(2)\cdot z(2n-2)+h(0)\cdot z(2n)+h(3)\cdot z(2n-3)-h(-1)\cdot z(2n-1) \quad (32)$$

Although the writing of sequential input data x(0) to x(7) and sequential output data z(1) to z(3) in the RAM 31 is omitted in FIG. 6, those pieces of data are also input and written in the RAM 31 in the same manner as the sequential input data x(8) and x(9) and the sequential output data z(4).

With m=4, first, sequential input data x(8) is read out from the RAM 31, and a filter coefficient h(0) is read out from the ROM 32 in association with that data. The multiplier 33 multiplies the sequential input data x(8) by the filter coefficient h(0), and supplies the multiplication result to the accumulator 34. At this time, the data in the accumulator 34 has been cleared, and data A1 given by an equation (33) is held directly in the register 36.

$$A1=h(0)\cdot x(8) \quad (33)$$

Next, sequential input data x(6) is read out from the RAM 31, and a filter coefficient h(2) is read out from the ROM 32 in association with that data. The multiplier 33 multiplies the sequential input data x(6) by the filter coefficient h(2), and supplies the multiplication result to the accumulator 34. The accumulator 34 accumulates the received multiplication result. Consequently, data A2, represented by equation (34), is held in the register 36 and is then output from the accumulator 34 to the register 37 where it is held.

$$A2=h(2)\cdot x(6)+A1=h(2)\cdot x(6)+h(0)\cdot x(8) \quad (34)$$

Similarly, sequential input data x(7) is read out from the RAM 31, and a filter coefficient h(1) is read out from the ROM 32 in association with that data. The multiplier 33 multiplies the sequential input data x(7) by the filter coefficient h(1), and supplies the multiplication result to the accumulator 34. At this time, the data in the accumulator 34 has been cleared, and data B1 given by an equation (35) is held directly in the register 36.

$$B1=h(1)\cdot x(7) \quad (35)$$

Next, sequential input data x(5) is read out from the RAM 31, and a filter coefficient h(3) is read out from the ROM 32 in association with that data. The multiplier 33 multiplies the sequential input data x(5) by the filter coefficient h(3), and supplies the multiplication result to the accumulator 34. The accumulator 34 accumulates the received multiplication result, and data B2 given by an equation (36) is held in the register 36, and is output from the accumulator 34 to be held in the register 38.

$$B2=h(3)\cdot x(5)+B1=h(3)\cdot x(5)+h(1)-(7) \quad (36)$$

Then, the data A2 and data B2 are input to the adder/subtracter 39 respectively from the registers 37 and 38. The adder/subtracter 39 adds the received data A2 and B2 together, and then subtracts the data B2 from the data A2. The addition result from the adder/subtracter 39, which is given by an equation (37), is held in the register 40 and is output as sequential output data $y_c(4)$.

$$A2+B2=h(2)\cdot x(6)+h(0)\cdot x(8)+h(3)\cdot x(5)+h(1)\cdot x(7) \quad (37)$$

The subtraction result, sequential output data z(4), from the adder/subtracter 39, which is given by an equation (38), is written as new sequential input data in the RAM 31 through the selector 41.

$$A2-B2=h(2)\cdot x(6)+h(0)\cdot x(8)-h(3)\cdot x(5)-h(1)\cdot x(7) \quad (38)$$

As a result, the operations expressed by the equations (29) and (30) have been executed.

With m=4, at which condition n=2, sequential output data z(4) is read out from the RAM 31, and a filter coefficient h(0) is read out from the ROM 32 in association with that data. The multiplier 33 multiplies the sequential output data z(4) by the filter coefficient h(0), and supplies the multiplication result to the accumulator 34. At this time, the data in the accumulator 34 has been cleared, and data C1 given by an equation (39) is held directly in the register 36.

$$C1=h(0)\cdot z(4) \quad (39)$$

Next, sequential output data z(2) is read out from the RAM 31, and a filter coefficient h(2) is read out from the ROM 32 in association with that data. The multiplier 33 multiplies the sequential output data z(2) by the filter coefficient h(2), and supplies the multiplication result to the accumulator 34. The accumulator 34 accumulates the received multiplication result, and data C2 given by an equation (40) is held in the register 36, and is output from the accumulator 34 to be held in the register 37.

$$C2=h(2)\cdot z(2)+C1=h(2)\cdot z(2)+h(0)\cdot z(4) \quad (40)$$

Similarly, sequential output data z(3) is read out from the RAM 31, and a filter coefficient h(1) is read out from the ROM 32 in association with that data. The multiplier 33 multiplies the sequential output data z(3) by the filter coefficient h(1), and supplies the multiplication result to the accumulator 34. At this time, the data in the accumulator 34 has been cleared, and data D1 given by an equation (41) is held directly in the register 36.

$$D1=h(1)\cdot z(3) \quad (41)$$

Next, sequential output data z(1) is read out from the RAM 31, and a filter coefficient h(3) is read out from the ROM 32 in association with that data. The multiplier 33 multiplies the sequential output data z(1) by the filter coefficient h(3), and supplies the multiplication result to the accumulator 34. The accumulator 34 accumulates the received multiplication result, and data D2 given by an equation (42) is held in the register 36, and is output from the accumulator 34 to be held in the register 38.

$$D2=h(3)\cdot z(1)+D1=h(3)\cdot z(1)+h(1)\cdot z(3) \quad (42)$$

Then, the data C2 and data D2 are input to the adder/subtracter 39 respectively from the registers 37 and 38. The adder/subtracter 39 adds the received data C2 and D2 together, and then subtracts the data D2 from the data C2. The operational results from the adder/subtracter 39 are held in the register 40. The addition result, which is given by an equation (43), is output as sequential output data $y_b(2)$, and the subtraction result, which is given by an equation (44), is output as sequential output data $y_a(2)$.

$$C2+D2=h(2)\cdot z(2)+h(0)\cdot z(4)+h(3)\cdot z(1)+h(1)\cdot z(3) \quad (43)$$

$$C2 = D2 = h(2) \cdot z(2) + h(0) \cdot z(4) - h(3) \cdot z(1) - h(1) \cdot z(3) \quad (44)$$

As a result, the operations expressed by the equations (31) and (32) have been executed.

The filter coefficient h(n) by which the sequential output data z(n) is multiplied, may differ from the filter coefficient h(n) by which the sequential input data x(n) is multiplied.

In the separation filter of this embodiment, as described above, a single piece of sequential input data can be separated into three pieces of sequential output data by simply adding the selector 41 to the separation filter of the first embodiment shown in FIG. 1. This embodiment can therefore make the circuit scale smaller than the prior art shown in FIG. 4.

Third Embodiment

Figure 8:
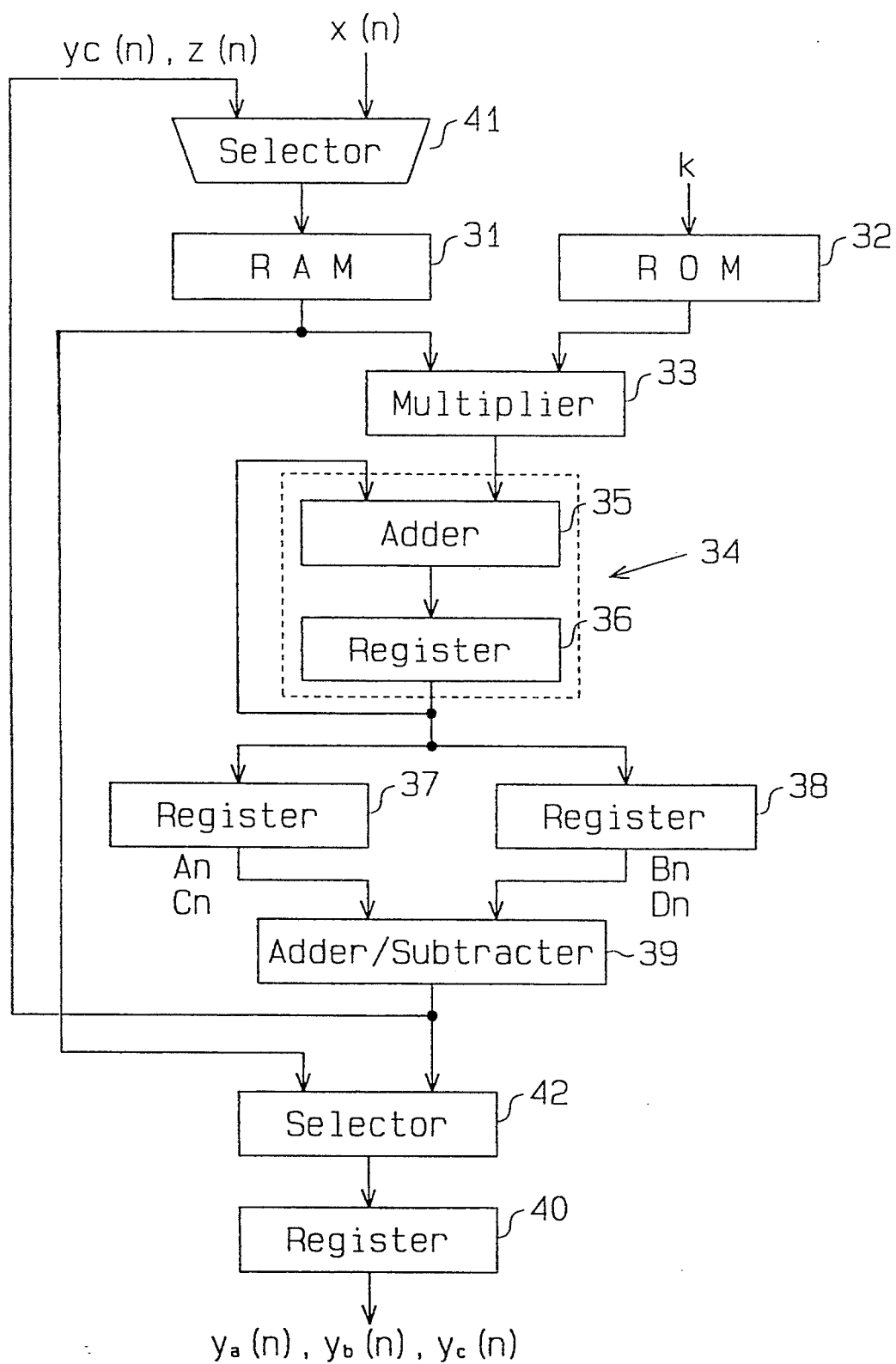
FIG. 8 is a block circuit diagram of a separation filter according to a third embodiment of this invention.

FIG. 8 shows the structure of a separation filter according to the second embodiment.

The selector 41 for switching between sequential input data x(n) and data output from the adder/subtracter 39 is provided on the input side of the RAM 31, and the selector 42 for switching between data read from the RAM 31 and data output from the adder/subtracter 39 is provided on the input side of the register 40. It is therefore possible to temporarily write the sequential output data $y_c(n)$, output from the adder/subtracter 39, into the RAM 31, read it from the RAM 31 at a given timing and store it in the register 40 via the selector 42. The RAM 31 thus serves as a delay circuit, so that the sequential output data $y_c(n)$, obtained through a single operation, will be output with the same timing as that for the sequential output data $y_a(n)$ and $y_b(n)$, which are obtained through two operations.

The operation of the separation filter according to this embodiment will now be described with reference to the timing chart given in FIG. 9. It is to be noted that the number of taps N is set to "2".

Although the writing of sequential input data x(0) to x(7) and sequential output data z(1) to z(3) in the RAM 31 is omitted in FIG. 9, those pieces of data are also input and written in the RAM 31 in the same manner as the sequential input data x(8) and x(9) and the sequential output data z(4). The computing process in this embodiment is the same as that in the second embodiment, and is carried out according to the equations (31) and (32).

With m=4, sequential input data x(8) and x(6) are read out from the RAM 31 in order, and filter coefficients h(0) and h(2) are read out in order from the ROM 32 in association with those pieces of data. The multiplier 33 multiplies the sequential input data x(8) by the filter coefficient h(0), and the sequential input data x(6) by the filter coefficient h(2), and supplies the multiplication results to the accumulator 34. The accumulator 34 accumulates the received multiplication results, and data A2 given by an equation (45) is finally held in the register 36, and is output from the accumulator 34 to be held in the register 37.

$$A2 = h(2) \cdot x(6) + A1 = h(2) \cdot x(6) + h(0) \cdot x(8) \quad (45)$$

Similarly, sequential input data x(7) and x(5) are read out in order from the RAM 31, and filter coefficients h(1) and h(3) are read out in order from the ROM 32 in association with those data. The multiplier 33 multiplies the sequential input data x(7) by the filter coefficient h(1) and the sequential input data x(5) by the filter coefficient h(3), and supplies the multiplication results to the accumulator 34. The accumulator 34 accumulates the received multiplication results, and data B2 given by an equation (46) is finally held in the register 36 and is output from the accumulator 34 to be held in the register 38.

$$B2 = h(3) \cdot x(5) + B1 = h(3) \cdot x(5) + h(1) \cdot x(7) \quad (46)$$

Then, sequential output data $y_c(2)$, written earlier, is read out from the RAM 31, and is held in the register 40 via the selector 42.

Then, the data A2 and data B2 are input to the adder/subtracter 39 respectively from the registers 37 and 38. The adder/subtracter 39 adds the received data A2 and B2 together, and then subtracts the data B2 from the data A2. The addition result from the adder/subtracter 39, which is given by an equation (47), is temporarily written as sequential output data $y_c(4)$ in the RAM 31 via the selector 41. The written sequential output data $y_c(4)$ is read out from the RAM 31 after passage of a predetermined period of time, and is held in the register 40 via the selector 42.

$$A2 + B2 = h(2) \cdot x(6) + h(0) \cdot x(8) + h(3) \cdot x(5) + h(1) \cdot x(7) \quad (47)$$

The subtraction result, sequential output data z(4), from the adder/subtracter 39, which is given by an equation (48), is written as new sequential input data in the RAM 31 through the selector 41.

$$A2 - S2 = h(2) \cdot x(6) + h(0) \cdot x(8) - h(3) \cdot x(5) - h(1) \cdot x(7) \quad (48)$$

Further, sequential output data z(4) and z(2) are read out in order from the RAM 31, and filter coefficients h(0) and h(2) are read out in order from the ROM 32 in association with those data. The multiplier 33 multiplies the sequential output data z(4) by the filter coefficient h(0) and the sequential output data z(2) by the filter coefficient h(2), and supplies the multiplication results to the accumulator 34. The accumulator 34 accumulates the received multiplication results, and data C2 given by an equation (49) is finally held in the register 36, and is output from the accumulator 34 to be held in the register 37.

$$C2 = h(2) \cdot z(2) + C1 = h(2) \cdot z(2) + h(0) \cdot x(4) \quad (49)$$

Similarly, sequential output data z(3) and z(1) are read out in order from the RAM 31, and filter coefficients h(1) and h(3) are sequentially read out from the ROM 32 in association with those data. The multiplier 33 multiplies the sequential output data z(3) by the filter coefficient h(1) and the sequential output data z(1) by the filter coefficient h(3) and supplies the multiplication results to the accumulator 34. The accumulator 34 accumulates the received multiplication results, and data D2 given by an equation (50) is finally held in the register 36, and is output from the accumulator 34 to be held in the register 38.

$$D2 = h(3) \cdot z(1) + D1 = h(3) \cdot z(1) + h(1) \cdot x(3) \quad (50)$$

Then, the data C2 and data D2 are input to the adder/subtracter 39 respectively from the registers 37 and 38. After adding the received data C2 and D2 together, the adder/subtracter 39 subtracts the data D2 from the data C2. The operational results from the adder/subtracter 39 are held in the register 40. The addition result, which is given by an equation (51), is output as sequential output data $y_b(2)$, and the subtraction result, which is given by an equation (52), is output as sequential output data $y_a(2)$.

$$C2+D2=h(2)\cdot z(2)+h(0)\cdot z(4)+h(3)\cdot z(1)+h(1)\cdot z(3) \quad (51)$$

$$C2-D2=h(2)\cdot z(2)+h(0)\cdot z(4)-h(3)\cdot z(1)-h(1)\cdot z(3) \quad (52)$$

Here, the sequential output data $y_c(4)$, obtained in an earlier operation, is already stored in the register 40, and the individual sequential output data $y_a(2)$, $y_b(2)$ and $y_c(4)$ will be output at the same timing.

Figure 7:
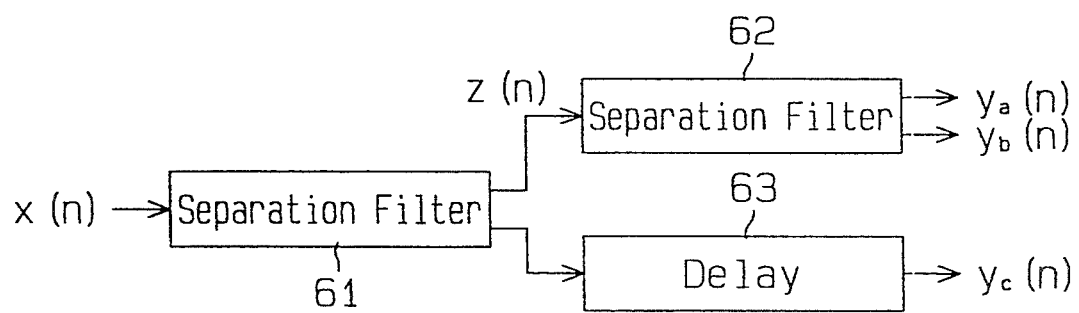
FIG. 7 is a block circuit diagram showing a structure which has multiplexed separation filters with a delay circuit added.

In the separation filter of this embodiment, as described above, the timings for outputting the individual sequential output data $y_a(2)$, $y_b(2)$ and $y_c(4)$ can be made the same by simply adding the selector 42 to the separation filter of the second embodiment shown in FIG. 5. This embodiment can therefore make the circuit scale smaller than the prior art shown in FIG. 7.

Fourth Embodiment

Figure 10:
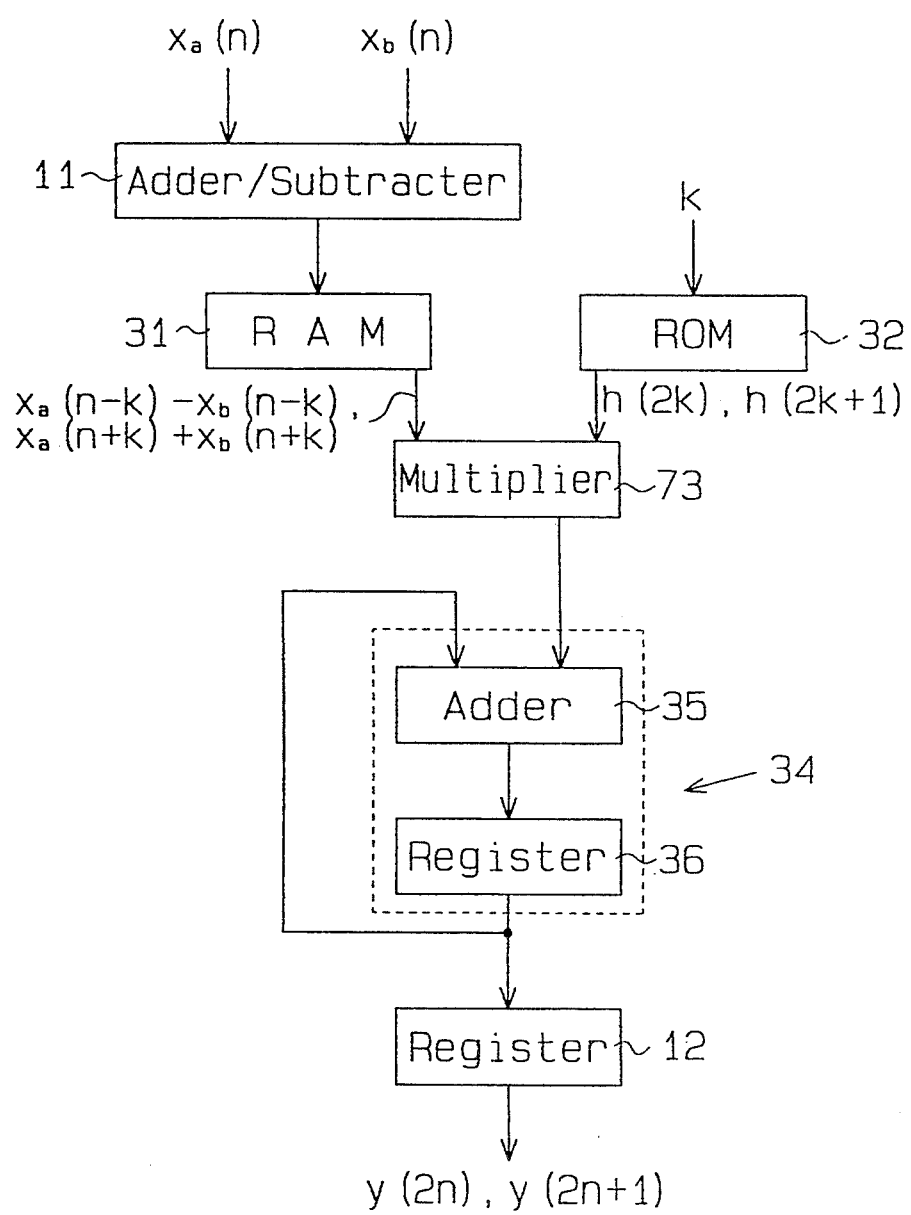
FIG. 10 is a block circuit diagram of a synthesizing filter according to a fourth embodiment of this invention.

FIG. 10 shows the structure of a synthesizing filter according to this embodiment.

The same reference numerals as used for the first embodiment shown in FIG. 1 are also used to denote the identical components of the fourth embodiment to avoid repeating their description.

An adder/subtracter 11 performs addition and subtraction on individual pieces of sequential input data $x_a(n)$ and $x_b(n)$ transferred in parallel. The RAM 31 stores the addition result and subtraction result from the adder/subtracter 11. The ROM 32 is holding a plurality of filter coefficients $h(k)$ and, when accessed, outputs a specific filter coefficient $h(k)$ in association with the value of k that increases every step. This "k" is the same as the one given in the equations (11) and (12). The output of the accumulator 34 is output via the register 37 as sequential output data $y(2n)$ and $y(2n+1)$, which are the sequential input data $x_a(n)$ and $x_b(n)$ synthesized.

The operation of the synthesizing filter according to this embodiment will now be described with reference to the timing chart given in FIG. 11. It is to be noted that the number of taps N is set to "4".

Substitution of the number of taps N=4 in the equations (11) and (12) yields equations (53) and (54).

$$\begin{aligned}
y(2n) = &\ h(0)\{x_a(n) - x_b(n)\} + \\
&\ h(2)\{x_a(n-1) - x_b(n-1)\} + \\
&\ h(4)\{x_a(n-2) - x_b(n-2)\} + \\
&\ h(6)\{x_a(n-3) - x_b(n-3)\}
\end{aligned} \quad (53)$$

$$\begin{aligned}
y(2n+1) = &\ h(1)\{x_a(n) + x_b(n)\} + \\
&\ h(3)\{x_a(n-1) + x_b(n-1)\} + \\
&\ h(5)\{x_a(n-2) + x_b(n-2)\} + \\
&\ h(7)\{x_a(n-3) + x_b(n-3)\}
\end{aligned} \quad (54)$$

Figure 11:
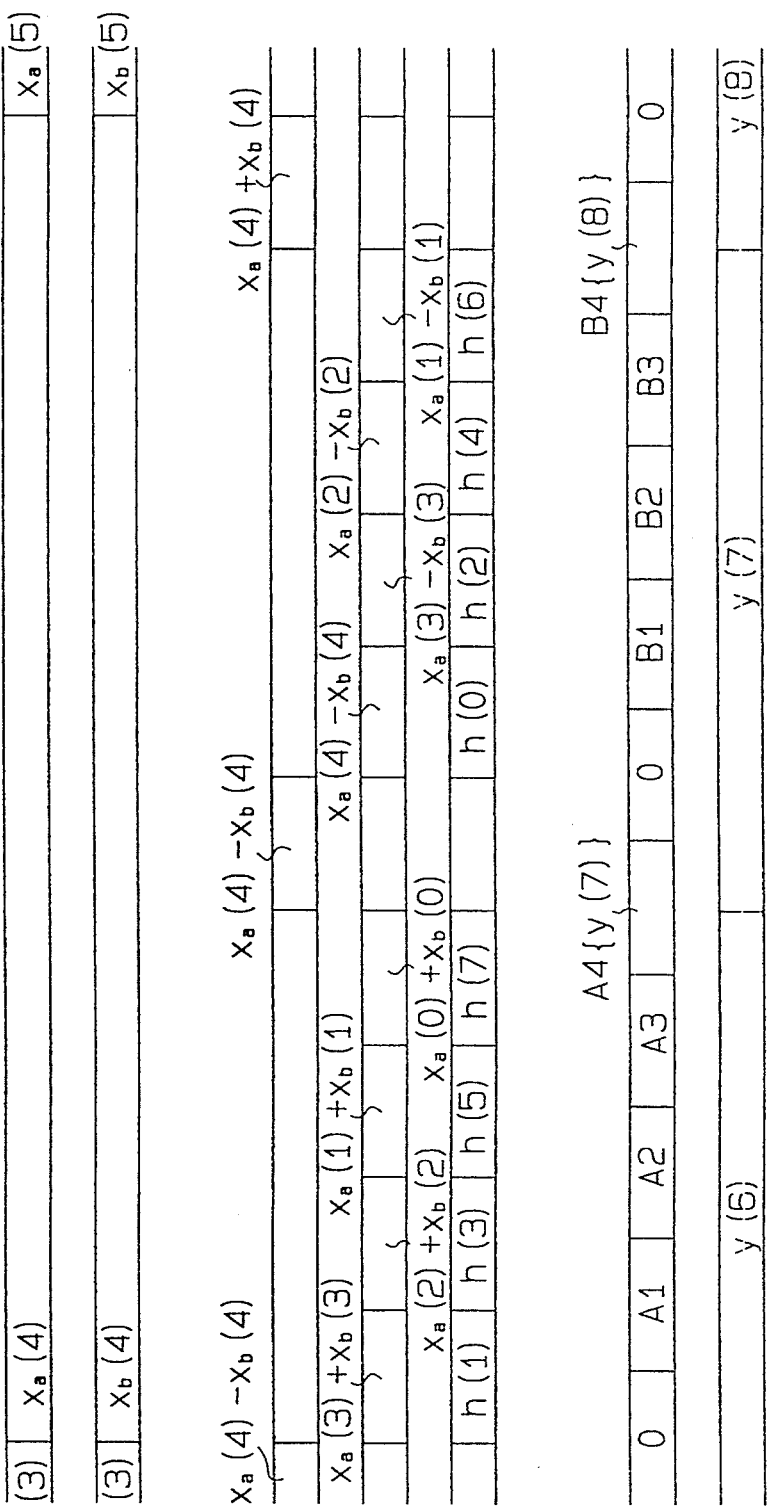
FIG. 11 is a timing chart for explaining the operation of the fourth embodiment.

Although the inputting of sequential input data $x_a(0)$ to $x_a(2)$ and $x_b(0)$ to $x_b(2)$ is omitted in FIG. 11, those pieces of sequential input data are also input in the same manner as the sequential input data $x_a(3)$, $x_b(4)$, etc. With n=3, the adder/subtracter 11 adds the sequential input data $x_a(3)$ and $x_b(3)$ together and writes the result in the RAM 31 first. Then, the added value $\{x_a(3)+x_b(3)\}$ and the added values $\{x_a(2)+x_b(2)\}$ to $\{x_a(0)+x_b(0)\}$, which have been written earlier, are sequentially read out from the RAM 31. At the same time, filter coefficients $h(1)$, $h(3)$, $h(5)$ and $h(7)$ corresponding to a filter coefficient $h(2k+1)$ are read out from the ROM 32.

The multiplier 33 multiplies each added value from the RAM 31 by the filter coefficient $h(2k+1)$ from the ROM 32. The register 36 is cleared every time one accumulation indicated by the equations (11) and (12) is completed. Accordingly, the multiplied value from the multiplier 33 is accumulated by the accumulator 34, yielding data A1 to A4 given by equations (55) to (58).

$$A1 = h(1)\{x_a(3)+x_b(3)\} \quad (55)$$

$$A2 = A1 + h(3)\{x_a(2)+x_b(2)\} \quad (56)$$

$$A3 = A2 + h(5)\{x_a(1)+x_b(1)\} \quad (57)$$

$$A4 = A3 + h(7)\{x_a(0)+x_b(0)\} = y(6) \quad (58)$$

The register 37 holds the accumulation result from the accumulator 34, i.e., sequential output data $y(7)$ {=A4}, and outputs it.

Next, the adder/subtracter 11 subtracts the sequential input data $x_b(4)$ from the sequential input data $x_a(4)$ and writes the result in the RAM 31. Then, the subtracted value $\{x_a(4)-x_b(4)\}$ and the added values $\{x_a(3)-x_b(3)\}$ to $\{x_a(1)-x_b(1)\}$, which have been written earlier, are sequentially read out from the RAM 31. At the same time, filter coefficients $h(0)$, $h(2)$, $h(4)$ and $h(6)$ corresponding to a filter coefficient $h(2k)$ are read out from the ROM 32.

The multiplier 33 multiplies each subtracted value from the RAM 31 by the filter coefficient $h(2k)$ from the ROM 32. At this time, the register 36 is cleared. Accordingly, the multiplied value from the multiplier 33 is accumulated by the accumulator 34, yielding data B1 to B4 given by equations (59) to (62).

$$B1 = h(0)\{x_a(4)-x_b(4)\} \quad (59)$$

$$B2 = B1 + h(2)\{x_a(3)-x_b(3)\} \quad (60)$$

$$B3 = B2 + h(4)\{x_a(2)-x_b(2)\} \quad (61)$$

$$B4 = B3 + h(6)\{x_a(1)-x_b(1)\} = y(7) \quad (62)$$

Then, the register 37 holds the accumulation result from the accumulator 34, i.e., sequential output data $y(8)$ {=B4}, and outputs it.

Thereafter, individual sequential output data $y(2n)$ and $y(2n+1)$ will be likewise output.

In the synthesizing filter of this embodiment, as described above, the adder/subtracter 11 adds the sequential input data $x_a(n)$ and $x_b(n)$ together or subtracts the sequential input data $x_b(n)$ from the sequential input data $x_a(n)$ to provide the added value or the subtracted value. Then, the multiplier 33 repeats the multiplication of the added value from the RAM 31 by the filter coefficient $h(2k+1)$ from the ROM 32 or the multiplication of the subtracted value from the RAM 31 by the filter coefficient $h(2k)$ from the ROM 32. The multiplication result is accumulated by the accumulator 34 to perform the operations expressed by the equations (53) and (54), yielding the individual sequential output data $y(2n)$ and $y(2n+1)$. According to this embodiment, therefore, the circuit scale will not increase even if the number of taps N increases.

Fifth Embodiment

Figure 12:
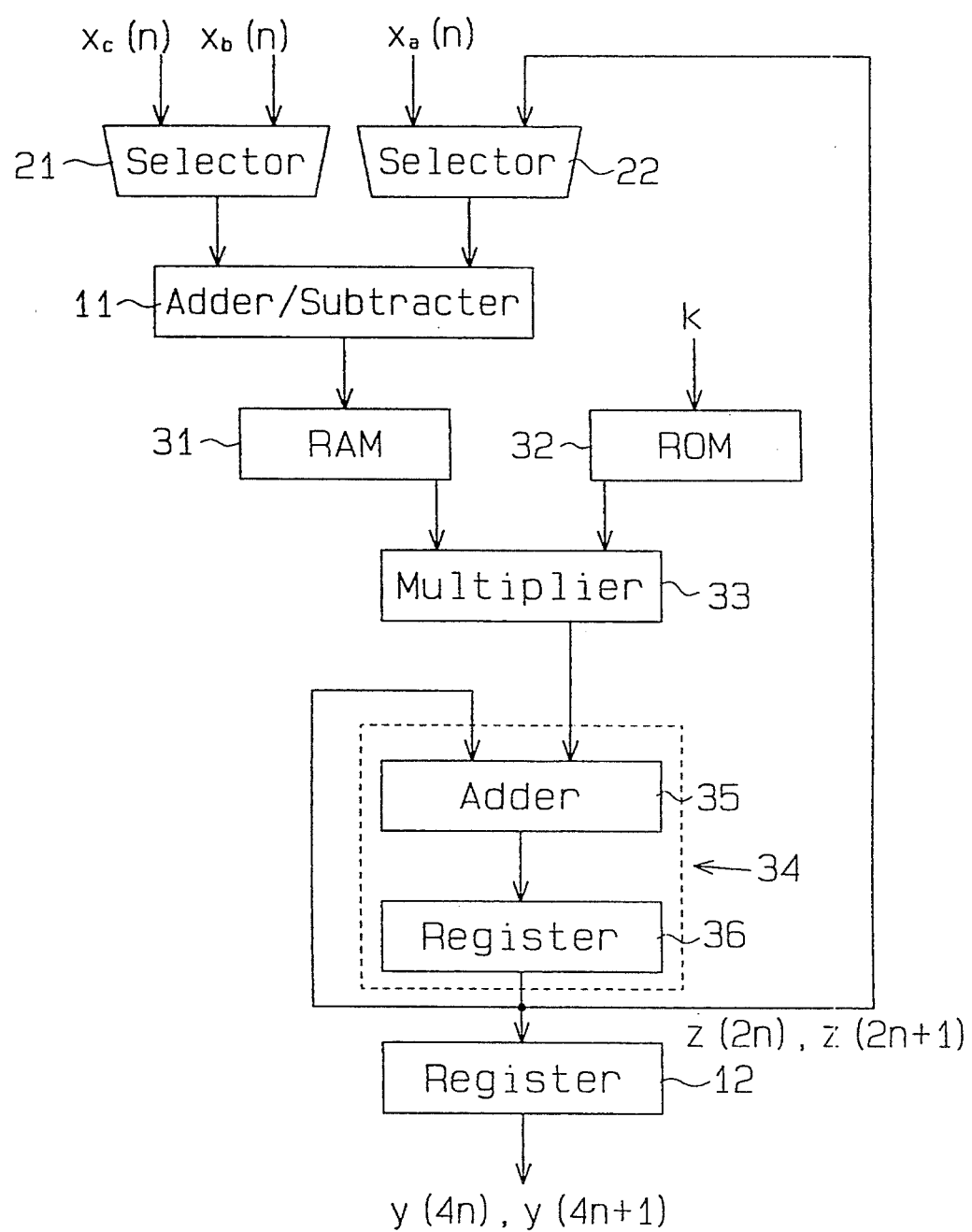
FIG. 12 is a block circuit diagram of a synthesizing filter according to a fifth embodiment of this invention.

FIG. 12 shows the structure of a synthesizing filter according to this embodiment.

The same reference numerals as used for the fourth embodiment shown in FIG. 10 are also used to denote the identical components of the fifth embodiment to avoid repeating their description.

A selector 21 is provided on the input side of the adder/subtracter 11 to selectively output sequential input data $x_b(n)$ and $x_c(n)$, transferred in parallel, to the adder/subtracter 11. Another selector 22 is also provided on the input side of the adder/subtracter to selectively output sequential input data $x_a(n)$ and sequential input data $z(2n)$ and $z(2n+1)$, output from the register 36, to the adder/subtracter 11. Therefore, sequential output data $z(2n)$ and $z(2n+1)$, which are the sequential input data $x_a(n)$ and $x_b(n)$ synthesized, are obtained through the first operation on those sequential input data $x_a(n)$ and $x_b(n)$. Then, sequential input data $y(4n)$ and $y(4n+1)$, which are the sequential input data $x_a(n)$, $x_b(n)$ and $x_c(n)$ synthesized, are obtained through the second operation on sequential output data $z(2n)$ and $z(2n+1)$ and the sequential input data $x_c(n)$.

The operation of the synthesizing filter according to this embodiment will now be described with reference to the timing chart given in FIG. 13. It is to be noted that the number of taps N is set to "2".

When the number of taps $N=2$ is used in the equations (11) and (12), and when $y(2n)$ and $y(2n+1)$ are replaced with $z(2n)$ and $z(2n+1)$ respectively, equations (63) and (64) are obtained.

$$z(2n)=h(0)\{x_a(n)-x_b(n)\}+h(2)\{x_a(n-1)-x_b(n-1)\} \qquad (63)$$

$$z(2n+1)=h(1)\{x_a(n)+x_b(n)\}+h(3)\{x_a(n-1)+x_b(n-1)\} \qquad (64)$$

Further, when the number of taps $N=2$ in the equations (11) and (12) is performed and $x_a(n)$ and $x_b(n)$ are replaced with $z(2n)$ and $x_c(2n)$ respectively, equations (65) and (66) are obtained.

$$y(4n)=h(0)\{z(2n)-x_c(2n)\}+h(2)\{z(2n-1)-x_c(2n-1)\} \qquad (65)$$

$$y(4n+1)=h(1)\{z(2n)+x_c(2n)\}+h(3)\{z(2n-1)+x_c(2n-1)\} \qquad (66)$$

Figure 13:
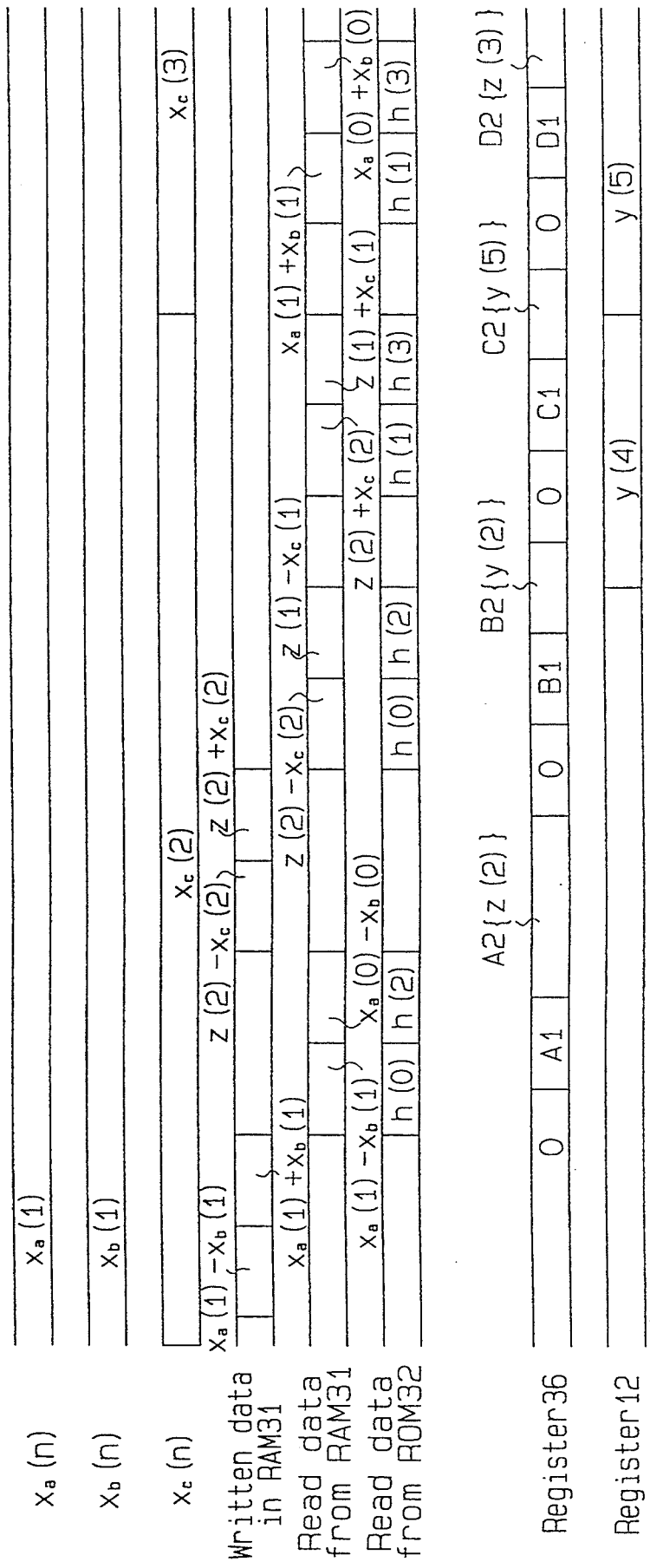
FIG. 13 is a timing chart for explaining the operation of the fifth embodiment.

Although the inputting of sequential input data $x_a(0)$, $x_b(0)$, $x_c(0)$ and $x_c(1)$ is omitted in FIG. 13, those pieces of sequential input data are also input in the same manner as the sequential input data $x_a(1)$, $x_b(1)$, $x_c(2)$, etc.

First, the selector 21 selects the sequential input data $x_b(1)$, and the selector 22 selects the sequential input data $x_a(1)$.

The adder/subtracter 11 subtracts the sequential input data $x_b(1)$ from the sequential input data $x_a(1)$ and writes the result in the RAM 31, and then adds those sequential input data $x_a(1)$ and $x_b(1)$ together and writes the result in the RAM 31.

Then, the subtracted value $\{x_a(1)-x_b(1)\}$, and the subtracted value $\{x_a(0)-x_b(0)\}$ which has been written earlier, are sequentially read out from the RAM 31. At the same time, filter coefficients h(0) and h(2) corresponding to a filter coefficient h(2k) are read out from the ROM 32.

The multiplier 33 multiplies each subtracted value from the RAM 31 by the filter coefficient h(2k) from the ROM 32. The register 36 is cleared every time one accumulation, indicated by the equations (11) and (12), is completed. Accordingly, the multiplied value from the multiplier 33 is accumulated by the accumulator 34, yielding data A1 and A2 given by equations (67) and (68), respectively.

$$A1=h(0)\{x_a(1)-x_b(1)\} \qquad (67)$$

$$A2=A1+h(2)\{x_a(0)-x_b(0)\}=z(2) \qquad (68)$$

At this time, data A2 (i.e., data $z(2)$) is already held in the register 36, and this data $z(2)$ is sent to the selector 22.

Then, the selector 21 selects the sequential input data $x_c(2)$ and the selector 22 selects the data $z(2)$.

The adder/subtracter 11 subtracts the sequential input data $x_c(2)$ from the data $z(2)$ and writes the result in the RAM 31, and then adds those data $z(2)$ and sequential input data $x_c(2)$ together and writes the result in the RAM 31.

Then, the subtracted value $\{z(2)-x_c(2)\}$, and the subtracted value $\{z(1)-x_c(1)\}$ which had been written earlier, are sequentially read out from the RAM 31. At the same time, filter coefficients h(0) and h(2) corresponding to the filter coefficient h(2k) are read out from the ROM 32.

The multiplier 33 multiplies each subtracted value from the RAM 31 by the filter coefficient h(2k) from the ROM 32. At this point, the register 36 is cleared. Accordingly, the multiplied value from the multiplier 33 is accumulated by the accumulator 34, yielding data B1 and B2 given by equations (69) and (70), respectively.

$$B1=h(0)\{z(2)-x_c(2)\} \qquad (69)$$

$$B2=B1+h(2)\{z(1)-x_c(1)\}=y(4) \qquad (70)$$

The register 37 holds the accumulation result from the accumulator 34, i.e., sequential output data $y(4)\{=B2\}$, and outputs it.

Then, the added value $\{z(2)+x_c(2)\}$ and the added value $\{z(1)+x_c(1)\}$ which had been written earlier, are sequentially read out from the RAM 31. At the same time, filter coefficients h(1) and h(3) corresponding to the filter coefficient h(2k+1) are read out from the ROM 32.

The multiplier 33 multiplies each added value from the RAM 31 by the filter coefficient h(2k+1) from the ROM 32. At this point, the register 36 is cleared. Accordingly, the multiplied value from the multiplier 33 is accumulated by the accumulator 34, yielding data C1 and C2 given by equations (71) and (72), respectively.

$$C1=h(1)\{z(2)-x_c(2)\} \qquad (71)$$

$$C2=C1+h(3)\{z(1)+x_c(1)\}=y(5) \qquad (72)$$

The register 37 holds the accumulation result from the accumulator 34, i.e., sequential output data $y(5)\{=C2\}$, and outputs it.

Then, the added value $\{x_a(1)+x_b(1)\}$, and the added value $\{x_a(0)+x_b(0)\}$ which had been written earlier, are sequentially read out from the RAM 31. At the same time, filter coefficients h(1) and h(3) corresponding to the filter coefficient h(2k+1) are read out from the ROM 32.

The multiplier 33 multiplies each added value from the RAM 31 by the filter coefficient h(2k+1) from the ROM 32. At this point, the register 36 is cleared. Accordingly, the multiplied value from the multiplier 33 is accumulated by the accumulator 34, yielding data D1 and D2 given by equations (73) and (74), respectively.

$$D1 = h(1)\{x_a(1) + x_b(1)\} \tag{73}$$

$$D2 = D1 + h(3)\{x_a(0) + x_b(0)\} = z(3) \tag{74}$$

At this point, the data D2 (i.e., data z(3)) is held in the register 36. The data z(3) in the register 36 is sent to the selector 22.

Thereafter, individual sequential output data y(4n) and y(4n+1) are likewise output. Consequently, the operations expressed by the equations (65) and (66) have been executed.

Figure 22:
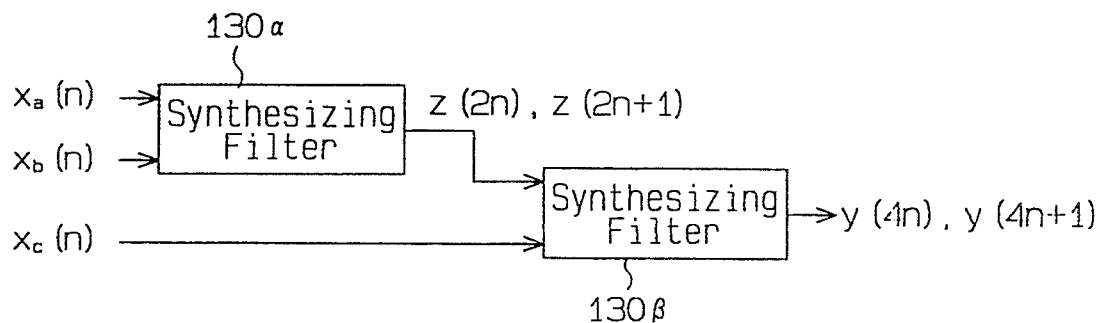
FIG. 22 is a block circuit diagram showing a structure having multiplexed synthesizing filters.

In the synthesizing filter of this embodiment, as described above, three pieces of sequential input data $x_a(n)$, $x_b(n)$ and $x_c(n)$ can be synthesized into a single piece of sequential output data y(4n), y(4n+1) by simply adding the selectors 21 and 22 to the synthesizing filter of the fourth embodiment shown in FIG. 10. This embodiment can therefore make the circuit scale smaller than the prior art shown in FIG. 22.

Sixth Embodiment

Figure 14:
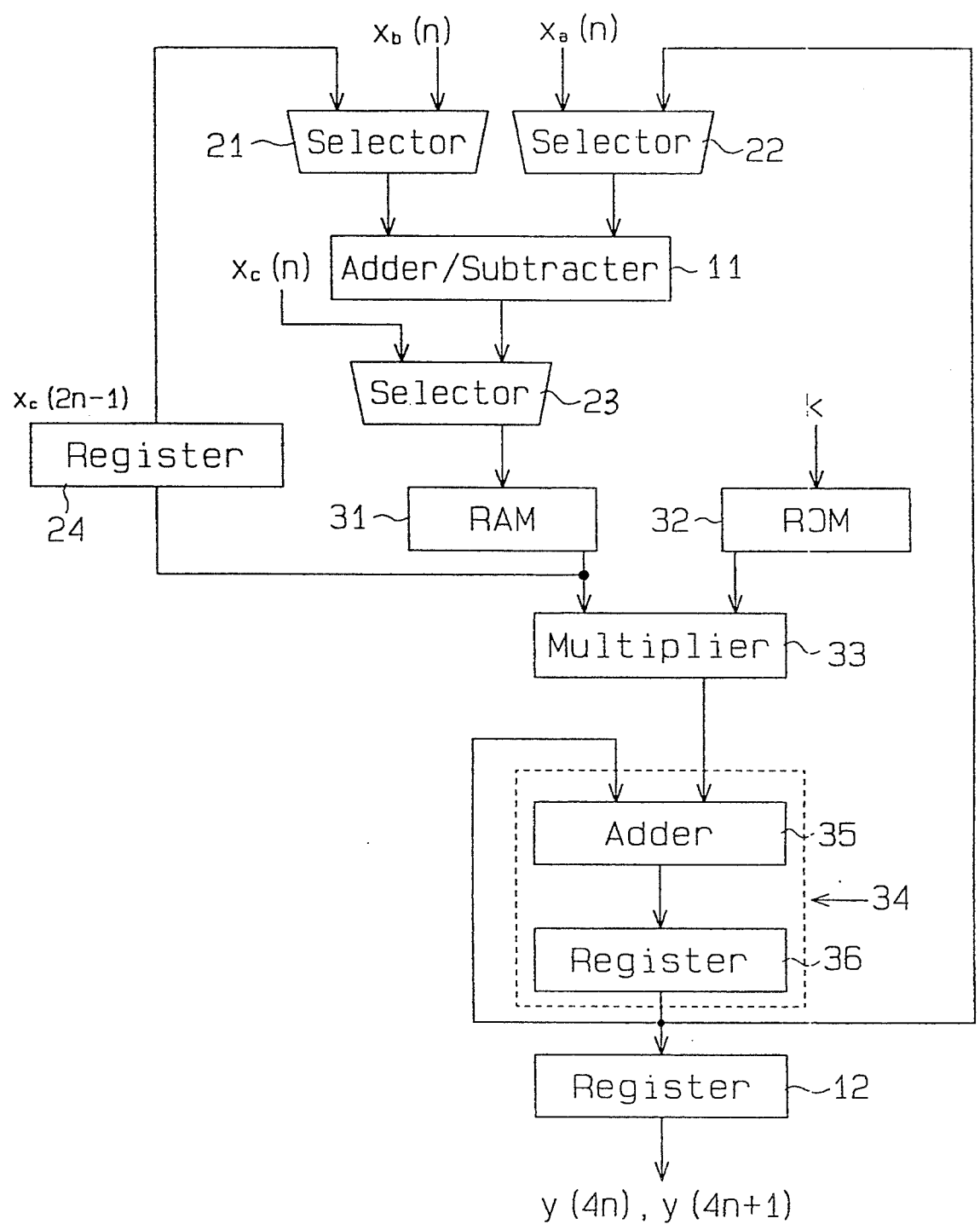
FIG. 14 is a block circuit diagram of a synthesizing filter according to a sixth embodiment of this invention.

FIG. 14 shows the structure of a synthesizing filter according to this embodiment.

The same reference numerals as used for the fifth embodiment shown in FIG. 12 are also used to denote the identical components of the sixth embodiment to avoid repeating their description.

A selector 23 is provided on the input side of the RAM 31 to selectively write the sequential input data $x_c(n)$ and the data, output from the adder/subtracter 11, into the RAM 31. The sequential input data $x_c(n)$ is read out from the RAM 31 at a given timing, and is sent via a register 24 to the selector 21. Therefore, the RAM 31 serves as a delay circuit to match the operational timing for the second operation with respect to the sequential output data z(2n) and z(2n+1) and the sequential input data $x_c(n)$, irrespective of the input timing for the sequential input data $x_c(n)$.

The operation of the synthesizing filter according to this embodiment will now be described with reference to the timing chart given in FIG. 15. It is to be noted that the number of taps N is set to "2".

When substitution of the number of taps N=2 in the equations (11) and (12) is performed and y(2n) and y(2n+1) are replaced with z(2n) and z(2n+1), respectively, equations (75) and (76) are obtained.

$$z(2n) = h(0)\{x_a(n) - x_b(n)\} + h(2)\{x_a(n-1) - x_b(n-1)\} \tag{75}$$

$$z(2n+1) = h(1)\{x_a(n) + x_b(n)\} + h(3)\{x_a(n-1) + x_b(n-1)\} \tag{76}$$

When substitution of the number of taps N=2 in the equations (11) and (12) is performed and $x_a(n)$ and $x_b(n)$ are replaced with z(2n) and $x_c(2n-1)$, respectively, equations (77) and (78) are obtained.

$$y(4n) = h(0)\{z(2n) - x_c(2n-1)\} + h(2)\{z(2n-1) - x_c(2n-2)\} \tag{77}$$

$$y(4n+1) = h(1)\{z(2n-1) + x_c(2n)\} + h(3)\{z(2n-2) + x_c(2n-1)\} \tag{78}$$

Figure 15:
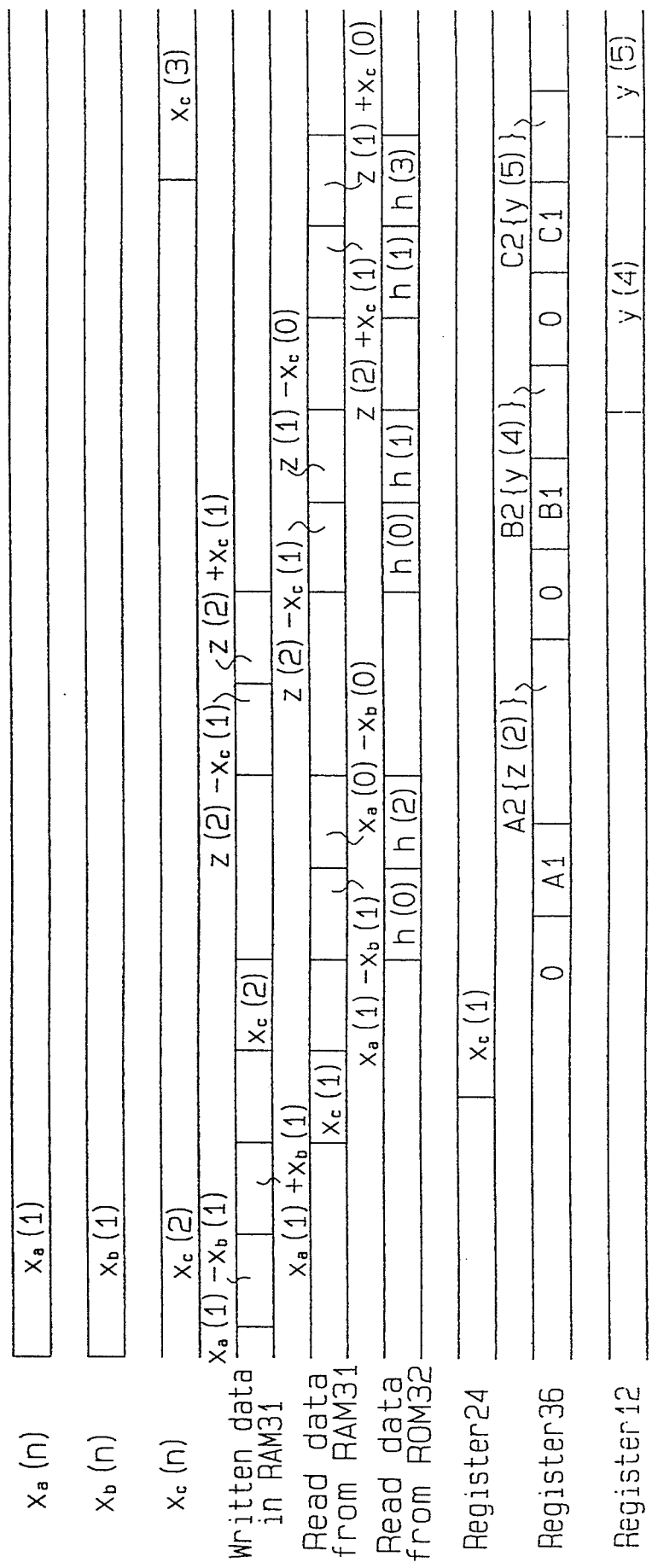
FIG. 15 is a timing chart for explaining the operation of the sixth embodiment.

Although the inputting of sequential input data $x_a(0)$, $x_b(0)$, $x_c(0)$ and $x_c(1)$ is omitted in FIG. 15, those pieces of sequential input data are also input in the same manner as the sequential input data $x_a(1)$, $x_b(1)$, $x_c(2)$, etc.

First, the selector 21 selects the sequential input data $x_b(1)$, and the selector 22 selects the sequential input data $x_a(1)$.

The adder/subtracter 11 subtracts the sequential input data $x_b(1)$ from the sequential input data $x_a(1)$ to yield a subtracted value, and then adds those sequential input data $x_a(1)$ and $x_b(1)$ together to yield an added value. The selector 23 selects the added or subtracted value from the adder/subtracter 11 to write the selected one in the RAM 31.

Then, the sequential input data $x_c(1)$, which has been written earlier, is read out from the RAM 31. The register 24 holds the sequential input data $x_c(1)$ from the RAM 31, and outputs it to the selector 21.

The selector 23 then selects the sequential input data $x_c(2)$ and writes it to RAM 31.

Then, the subtracted value $\{x_a(1) - x_b(1)\}$, and the subtracted value $\{x_a(0) - x_b(0)\}$ which has been written earlier, are sequentially read out from the RAM 31. At the same time, filter coefficients h(0) and h(2) corresponding to a filter coefficient h(2k) are read out from the ROM 32.

The multiplier 33 multiplies each subtracted value from the RAM 31 by the filter coefficient h(2k) from the ROM 32. The register 36 is cleared every time one accumulation indicated by the equations (9) and (10) is completed. Accordingly, the multiplied value from the multiplier 33 is accumulated by the accumulator 34, yielding data A1 and A2 given by equations (79) and (80), respectively.

$$A1 = h(0)\{x_a(1) - x_b(1)\} \tag{79}$$

$$A2 = A1 + h(2)\{x_a(0) - x_b(0)\} = z(2) \tag{80}$$

At this time, data A2 (i.e., data z(2)) is already held in the register 36. The data z(2) in the register 36 is sent to the selector 22.

Then, the selector 21 selects the sequential input data $x_c(1)$, output from the register 24, and the selector 22 selects the data z(2).

The adder/subtracter 11 subtracts the sequential input data $x_a(1)$ from the data z(2) to yield a subtracted value, and then adds that data z(2) and sequential input data $x_c(1)$ together to yield an added value. The selector 23 selects the added or subtracted value from the adder/subtracter 11, and writes the selected one in the RAM 31.

Then, the subtracted value $\{z(2) - x_c(1)\}$, and the subtracted value $\{z(1) - x_c(0)\}$ which has been written earlier, are sequentially read out from the RAM 31. At the same time, filter coefficients h(0) and h(2) corresponding to the filter coefficient h(2k) are read out from the ROM 32.

The multiplier 33 multiplies each subtracted value from the RAM 31 by the filter coefficient h(2k) from the ROM 32. At this point, the register 36 is cleared. Accordingly, the multiplied value from the multiplier 33 is accumulated by the accumulator 34, yielding data B1 and B2 given by equations (81) and (82), respectively.

$$B1 = h(0)\{z(2) - x_c(1)\} \tag{81}$$

$$B2 = B1 + h(2)\{z(1) - x_c(0)\} = y(4) \tag{82}$$

The register 37 holds the accumulation result from the accumulator 34, i.e., sequential output data y(4) {=B2}, and outputs it.

Then, the added value $\{z(2) + x_c(1)\}$, and the added values $\{z(1) + x_c(0)\}$ which has been written earlier, are sequentially read out from the RAM 31. At the same time, filter coefficients h(1) and h(3) corresponding to the filter coefficient h(2k+1) are read out from the ROM 32.

The multiplier 33 multiplies each added value from the RAM 31 by the filter coefficient h(2k+1) from the ROM 32. At this point, the register 36 is cleared. Accordingly, the multiplied value from the multiplier 33 is accumulated by the accumulator 34, yielding data C1 and C2 given by equations (83) and (84), respectively.

$$C1 = h(1)\{z(2) + x_c(1)\} \tag{83}$$

$$C2 = C1 + h(3)\{z(1) - x_c(0)\} = y(5) \tag{84}$$

The register 37 holds the accumulation result from the accumulator 34, i.e., sequential output data y(5) {=C2}, and outputs it.

Thereafter, individual sequential output data y(4n) and y(4n+1) are likewise output. Consequently, the operations expressed by the equations (77) and (78) have been executed.

Figure 23:
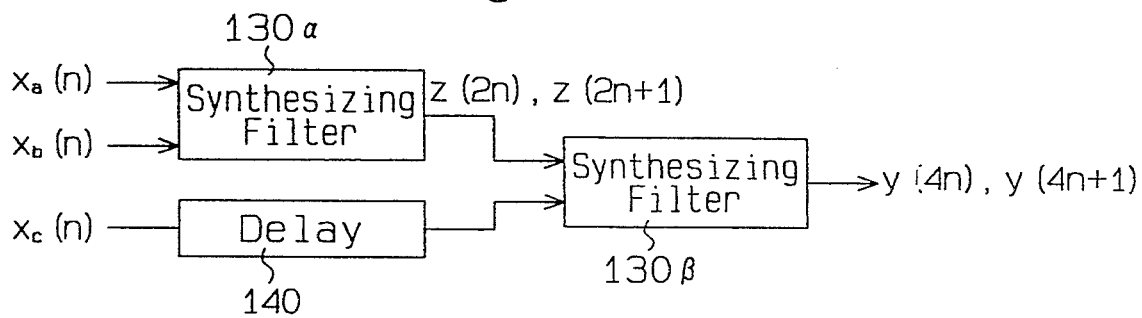
FIG. 23 is a block circuit diagram showing a structure which has multiplexed synthesizing filters with a delay circuit added.

In the synthesizing filter of this embodiment, as described above, the sequential input data $x_c(n)$ can be delayed in accordance with the output timings for the sequential output data z(2n) and z(2n+1) by simply adding the selector 23 and register 24 to the synthesizing filter of the fifth embodiment shown in FIG. 12. This embodiment can therefore make the circuit scale smaller than the prior art shown in FIG. 23.

Seventh Embodiment

Figure 16:
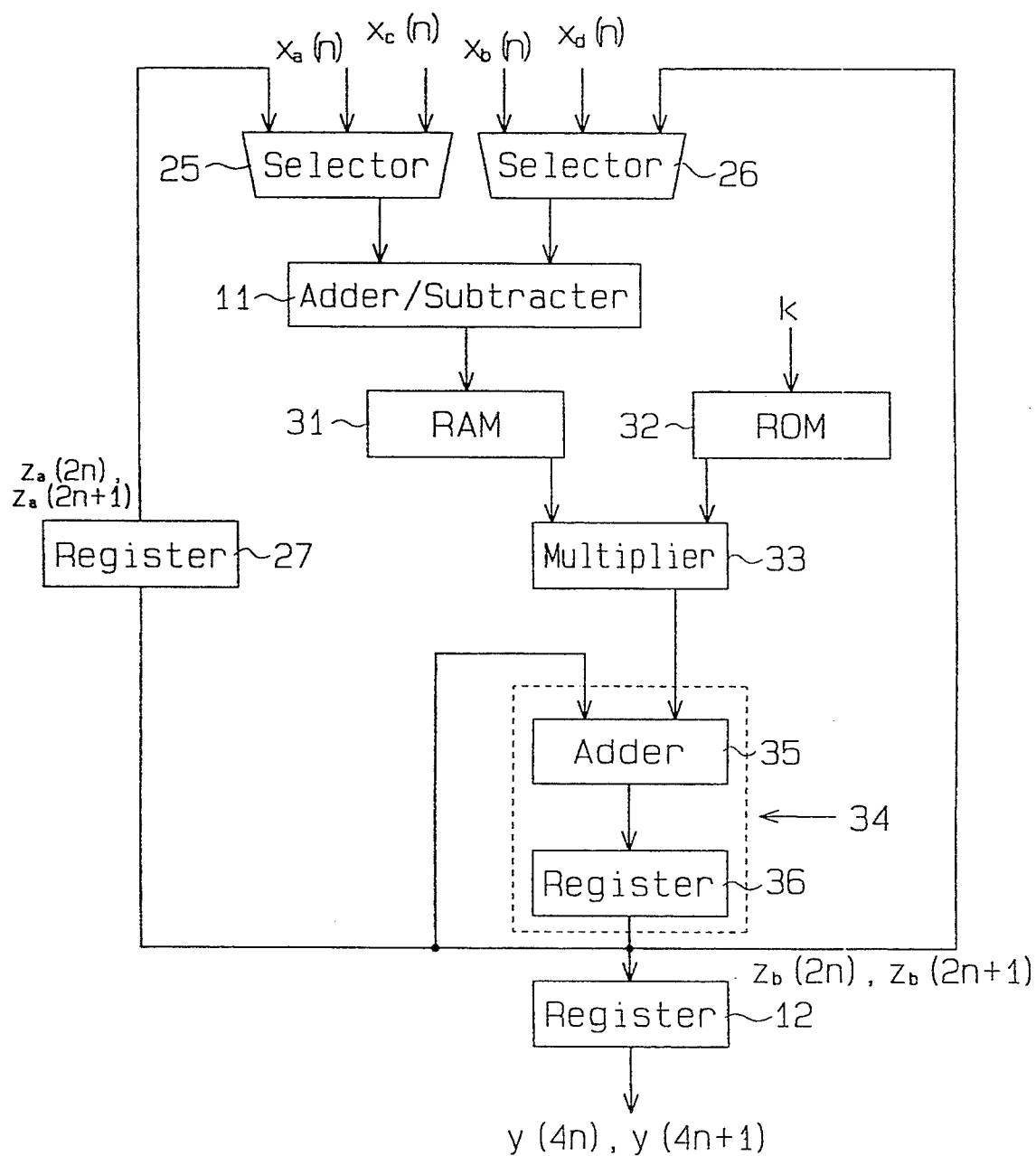
FIG. 16 is a block circuit diagram of a synthesizing filter according to a seventh embodiment of this invention.
Figure 18:
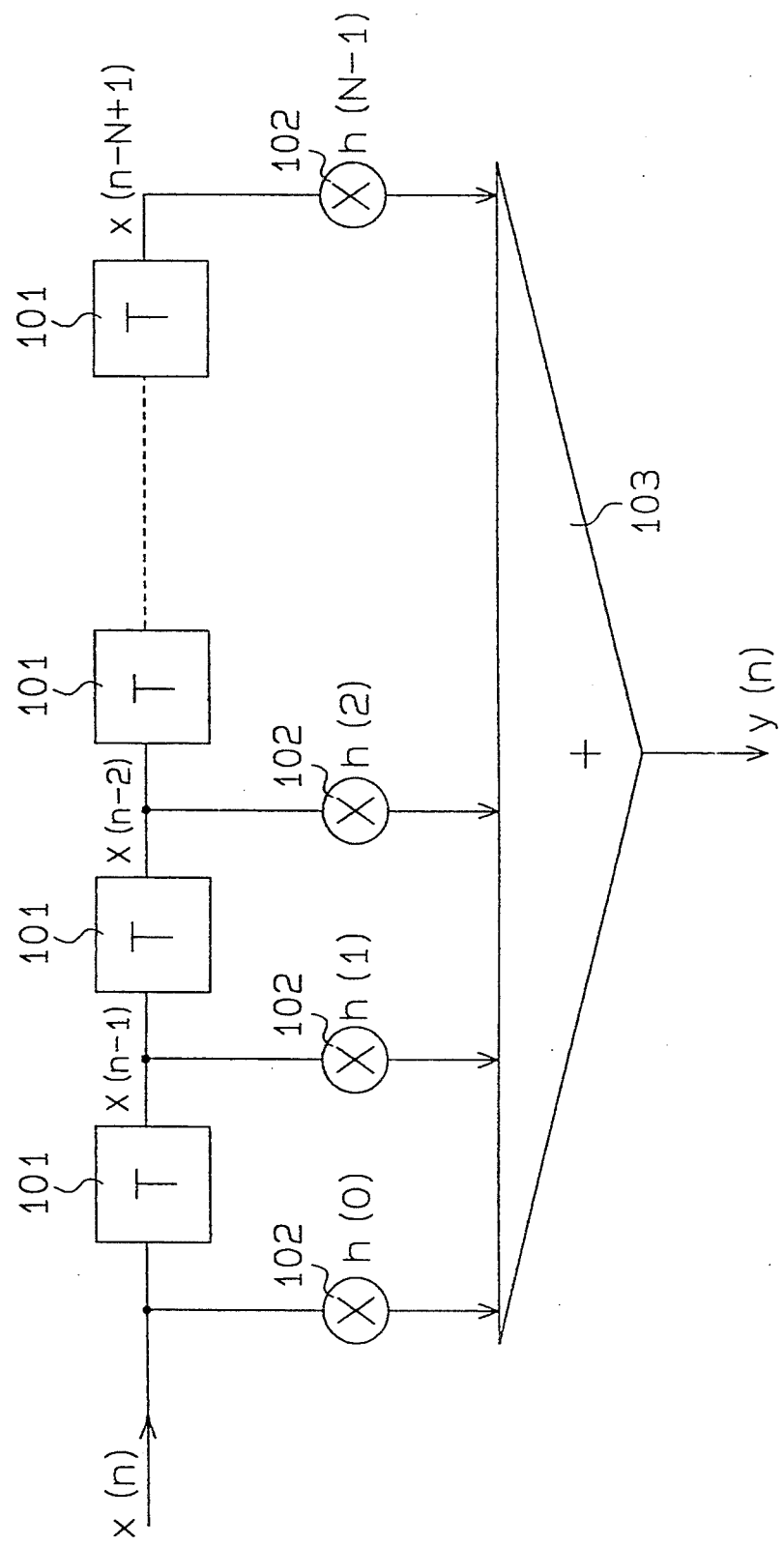
FIG. 18 is a block circuit diagram of a conventional FIR filter.
Figure 19:
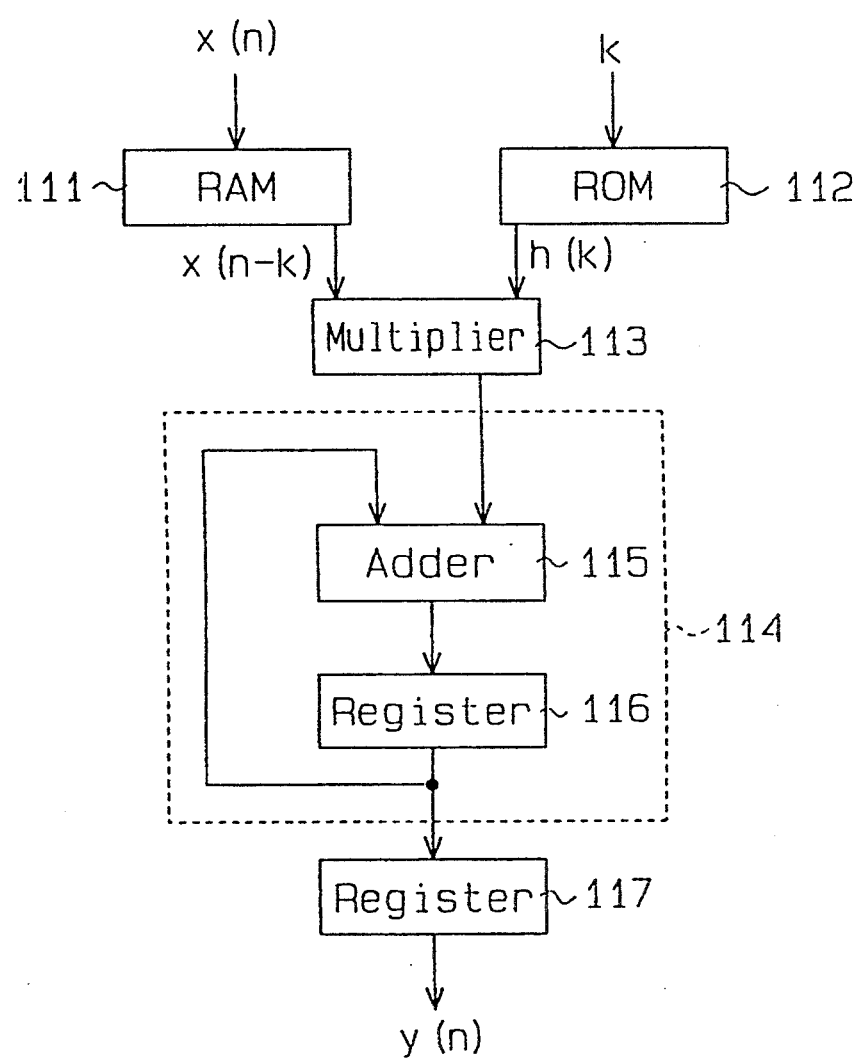
FIG. 19 is a block circuit diagram of a conventional stored program type FIR filter.

FIG. 16 shows the structure of a synthesizing filter according to this embodiment.

The same reference numerals as used for the fourth embodiment shown in FIG. 10 are also used to denote the identical components of this embodiment to avoid repeating their description.

The sequential output data $z_a(2n)$ and $z_a(2n+1)$, obtained by the first operation on the sequential input data $x_a(n)$ and $x_b(n)$, are sent via a register 27 to a selector 25 from the register 36. The sequential output data $z_b(2n)$ and $z_b(2n+1)$, obtained by the first operation on the sequential input data $x_c(n)$ and $x_d(n)$, are sent to a selector 26 from the register 36. The selector 25 selectively sends the sequential input data $x_a(n)$ and $x_c(n)$ and sequential output data $z_a(2n)$ and $z_a(2n+1)$ to the adder/subtracter 11. The selector 26 selectively sends the sequential input data $x_b(n)$ and $x_d(n)$ and sequential output data $z_b(2n)$ and $z_b(2n+1)$ to the adder/subtracter 11. Therefore, sequential output data y(4n) and y(4n+1), which are the sequential input data $x_a(n)$, $x_b(n)$, $x_c(n)$ and $x_d(n)$ synthesized, are obtained through the second operation on the individual sequential output data $z_a(2n)$, $z_a(2n+1)$, $z_b(2n)$ and $z_b(2n+1)$.

The operation of the synthesizing filter according to this embodiment will now be described with reference to the timing chart given in FIG. 17. It is to be noted that the number of taps N is set to "2".

When the number of taps N=2 is used in equations (11) and (12), and when y(2n) and y(2n+1) are replaced with $z_a(2n)$ and $z_a(2n+1)$, respectively, equations (85) and (86) are obtained.

$$z_a(2n) = h(0)\{x_a(n) - x_b(n)\} + h(2)\{x_a(n-1) - x_b(n-1)\} \tag{85}$$

$$z_a(2n+1) = h(1)\{x_a(n) + x_b(n)\} + h(3)\{x_a(n-1) + x_b(n-1)\} \tag{86}$$

When the number of taps N=2 is used in the equations (11) and (12), when $x_a(n)$ and $x_b(n)$ are replaced with $x_c(n)$ and $x_d(n)$ respectively, and when y(2n) and y(2n+1) are replaced with $z_b(2n)$ and $z_b(2n+1)$ respectively, equations (87) and (88) are obtained.

$$z_b(2n) = h(0)\{x_c(n) - x_d(n)\} + h(2)\{x_c(n-1) - x_d(n-1)\} \tag{87}$$

$$z_b(2n+1) = h(1)\{x_c(n) + x_d(n)\} + h(3)\{x_c(n-1) + x_d(n-1)\} \tag{88}$$

Further, when substitution of the number of taps N=2 in the equations (9) and (10) is performed and $x_a(n)$ and $x_b(n)$ are replaced with $z_a(2n)$ and $z_b(2n)$, respectively, equations (89) and (90) are obtained.

$$y(4n) = h(0)\{z_a(2n) - z_b(2n)\} + h(2)\{z_a(2n-1) - z_b(2n-1)\} \tag{89}$$

$$y(4n+1) = h(1)\{z_a(2n) + z_b(2n)\} + h(3)\{z_a(2n-1) + z_b(2n-1)\} \tag{90}$$

Although the inputting of sequential input data $x_a(0)$, $x_b(0)$, $x_c(0)$ and $x_d(0)$ is omitted in FIG. 17, those pieces of sequential input data are also input in the same manner as the sequential input data $x_a(1)$, $x_b(1)$, $x_c(1)$ and $x_d(1)$.

First, the selector 25 selects the sequential input data $x_a(1)$ and the selector 26 selects the sequential input data $x_b(1)$.

The adder/subtracter 11 subtracts the sequential input data $x_b(1)$ from the sequential input data $x_a(1)$ and writes the result in the RAM 31, and then adds those sequential input data $x_a(1)$ and $x_b(1)$ together and writes the result in the RAM 31.

Then, the subtracted value $\{x_a(1) - x_b(1)\}$, and the subtracted value $\{x_a(0) - x_b(0)\}$ which has been written earlier, are sequentially read out from the RAM 31. At the same time, filter coefficients h(0) and h(2) corresponding to a filter coefficient h(2k) are read out from the ROM 32.

The multiplier 33 multiplies each subtracted value from the RAM 31 by the filter coefficient h(2k) from the ROM 32. The register 36 is cleared every time one accumulation indicated by the equations (11) and (12) is completed. Accordingly, the multiplied value from the multiplier 33 is accumulated by the accumulator 34, yielding data A1 and A2 given by equations (91) and (92).

$$A1 = h(0)\{x_a(1) - x_b(1)\} \tag{91}$$

$$A2 = A1 + h(2)\{x_a(0) - x_b(0)\} = z_a(2) \tag{92}$$

At this time, the data A2 (i.e., data $z_a(2)$) is already held in the register 36. The data $z_a(2)$ in the register 36 is sent to the selectors 26 and 27.

The register 27 holds the data $z_a(2)$ from the register 36, and outputs it to the selector 25.

Then, the selector 25 selects the sequential input data $x_c(1)$ and the selector 26 selects the sequential input data The adder/subtracter 11 subtracts the sequential input data $x_d(1)$ from the sequential input data $x_c(1)$ and writes the result in the RAM 31, and then adds those sequential input data $x_c(1)$ and $x_d(1)$ together and writes the result in the RAM 31.

Then, the subtracted value $\{x_c(1) - x_d(1)\}$ and the subtracted value $\{x_c(0) - x_d(0)\}$, which had been written earlier, are sequentially read out from the RAM 31. At the same time, filter coefficients h(0) and h(2) corresponding to the filter coefficient h(2k) are read out from the ROM 32.

The multiplier 33 multiplies each subtracted value from the RAM 31 by the filter coefficient h(2k) from the ROM 32. At this point, the register 36 is cleared. Accordingly, the multiplied value from the multiplier 33 is accumulated by the accumulator 34, yielding data B1 and B2 given by equations (93) and (94).

$$B1 = h(0)\{x_c(1) - x_d(1)\} \tag{93}$$

$$B2 = B1 + h(2)\{x_c(0) - x_d(0)\} = z_b(2) \tag{94}$$

At this time, the data B2 (i.e., data $z_b(2)$) is already held in the register 36. The data $z_b(2)$ in the register 36 is sent to the selectors 26 and 27.

As the register 27 is already holding the data $z_a(2)$, it does not accept the data $z_b(2)$ from the register 36.

Then, the selector 25 selects the sequential input data $z_a(2)$ and the selector 26 selects the sequential input data $z_b(2)$.

The adder/subtracter 11 subtracts the sequential input data $z_b(2)$ from the sequential input data $z_a(2)$ and writes the result in the RAM 31, and then adds those sequential input data $z_b(2)$ and $z_b(2)$ together and writes the result in the RAM 31.

Then, the subtracted value $\{z_a(2) - z_b(2)\}$, and the subtracted value $\{z_a(1) - z_b(1)\}$ which has been written earlier, are sequentially read out from the RAM 31. At the same time, filter coefficients h(0) and h(2) corresponding to the filter coefficient h(2k) are read out from the ROM 32.

The multiplier 33 multiplies each subtracted value from the RAM 31 by the filter coefficient h(2k) from the ROM 32. At this point, the register 36 is cleared. Accordingly, the multiplied value from the multiplier 33 is accumulated by the accumulator 34, yielding data C1 and C2 given by equations (95) and (96).

$$C1 = h(0)\{z_a(2) - z_b(2)\} \tag{95}$$

$$C2 = C1 + h(2)\{z_a(1) - z_b(1)\} = y(4) \tag{96}$$

The register 37 holds the accumulation result from the accumulator 34, i.e., sequential output data y(4) $\{=C2\}$, and outputs it.

Then, the added value $\{z_b(2) + z_b(2)\}$, and the added values $\{z_a(1) + z_b(1)\}$ which has been written earlier, are sequentially read out from the RAM 31. At the same time, filter coefficients h(1) and h(3) corresponding to the filter coefficient h(2k+1) are read out from the ROM 32.

The multiplier 33 multiplies each added value from the RAM 31 by the filter coefficient h(2k+1) from the ROM 32. At this point, the register 36 is cleared. Accordingly, the multiplied value from the multiplier 33 is accumulated by the accumulator 34, yielding data D1 and D2 given by equations (97) and (98).

$$D1 = h(1)\{z_a(2) + z_b(2)\} \tag{97}$$

$$D2 = D1 + h(3)\{z_a(1) + z_b(1)\} = y(5) \tag{98}$$

The register 37 holds the accumulation result from the accumulator 34, i.e., sequential output data y(5) $\{=D2\}$, and outputs it.

Thereafter, individual sequential output data y(4n) and y(4n+1) are likewise output. Consequently, the operations expressed by the equations (89) and (90) have been executed.

Figure 24:
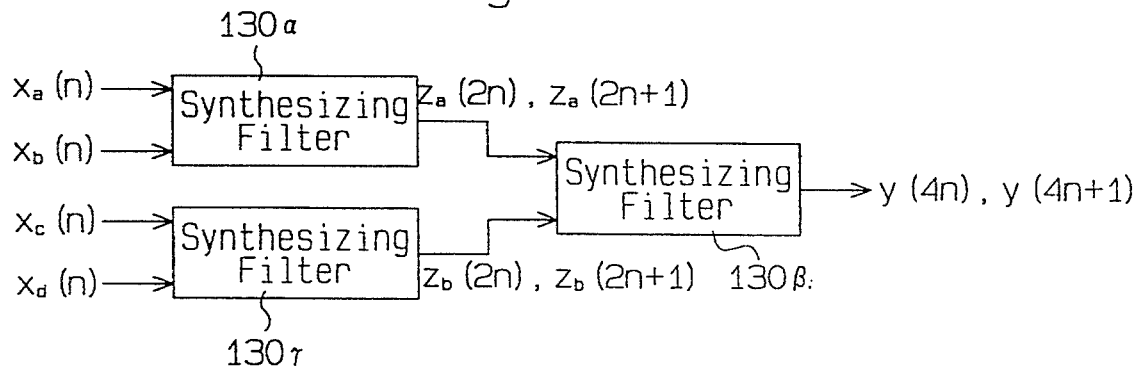
FIG. 24 is a block circuit diagram showing another structure having multiplexed synthesizing filters.

In the synthesizing filter of this embodiment, the sequential output data y(4n) and y(4n+1), is formed from the synthesis of four pieces of sequential input data $x_a(n)$, $x_b(n)$, $x_c(n)$ and $x_d(n)$, and is obtained by simply adding the output of selectors 25 and 26 and register 27 to the synthesizing filter of the fourth embodiment as shown in FIG. 10. This embodiment provides, therefore, a separation filter circuit having a smaller scale than the prior art circuit as shown in FIG. 24.

As described in detail above, this invention can provide a separation filter or a synthesizing filter, which will not increase the circuit scale even when the number of taps N considered increases. This invention can also provide a digital filter which will separate or synthesize three or more pieces of sequential input data without increasing the circuit scale.

This invention is in no way limited to the above-described embodiments. Although the first to third embodiments are concerned with the case of separating a single piece of sequential input data x(n) to two or three pieces of sequential output data $y_a(n)$, $y_b(n)$ and $y_c(n)$, the data output from the adder/subtracter 39 may be written in the RAM 31 repeatedly to be multiplied by the filter coefficient h(n), so that one piece of sequential input data x(n) can be separated to four or more pieces of sequential output data.

In addition, the fourth to seventh embodiments can also be adapted for plural pieces of sequential input data sent in a serial manner, rather than in parallel. In this case, the selector 21 may be eliminated from the fourth embodiment by properly setting the timing for transferring the individual pieces of sequential input data $x_a(n)$, $x_b(n)$ and $x_c(n)$.

Further, in the fourth embodiment, the selector 21 may be replaced by a selector which selects one of three or more inputs and the processing may be repeated, thus allowing four or more pieces of sequential input data to be synthesized.

In the fifth embodiment, the RAM 31 may be replaced with a memory which can be accessed for data reading and data writing at the same time, thus eliminating the need for the register 24.

Furthermore, the selector 25 may be replaced with a selector which selects one of four or more inputs and the processing may be repeated, thus allowing five or more pieces of sequential input data to be synthesized.

What is claimed is:

1. A digital filter comprising:
   a first memory means for storing sequential input data;
   a multiplier means for multiplying said sequential input data, read from said first memory means, by a predetermined filter coefficient, and for generating a product obtained thereby;

an accumulator means for accumulating the product generated from said multiplier means and for generating accumulated data therefrom;

a pair of register means for alternately receiving the accumulated data from said accumulator means; and an adder/subtracter means for performing an addition and subtraction operation on the accumulated data obtained from said pair of register means, and for generating two sequential output data separated from said sequential input data.

2. The digital filter according to claim 1, further comprising a second memory means having a plurality of filter coefficients stored therein, said second memory means operating to produce an incrementally increasing filter coefficient to said multiplier means.

3. A digital filter comprising:

a memory means for storing sequential input data;

a multiplier for multiplying said sequential input data, read from said memory means, by a predetermined filter coefficient, and for generating a product obtained thereby;

an accumulator means for accumulating the product output from said multiplier means and for generating accumulated data therefrom;

a pair of register means for alternately receiving the accumulated data output from said accumulator means;

an adder/subtracter means for performing an addition and subtraction operation on the accumulated data obtained from said pair of register means, and for generating two sequential output data separated from said sequential input data; and a selector means for selectively producing said sequential input data and said sequential output data from said adder/subtracter means to said memory means.

4. A digital filter comprising:

a memory means for storing sequential input data;

a multiplier means for multiplying said sequential input data, read from said memory means, by a predetermined filter coefficient, and for generating a product obtained thereby;

an accumulator means for accumulating the product output from said multiplier and for generating accumulated data therefrom;

a pair of register means for alternately receiving the accumulated data from said accumulator;

an adder/subtracter means for performing an addition and subtraction operation on the accumulated data obtained from said pair of register means, and for generating two sequential output data separated from said sequential input data;

a first selector means for selectively producing said sequential input data and said sequential output data from said adder/subtracter means to said memory means; and a second selector means for selectively producing said sequential output data generated from said adder/subtracter means and said sequential output data, produced to said memory means from said first selector means.

5. A digital filter comprising:

an adder/subtracter means for performing an addition and subtraction operation on two sequential input data and for generating a result produced therefrom;

a first memory means for storing the result output by said adder/subtracter means;

a multiplier means for multiplying the result output from said adder/subtracter means, read from said first memory means, by a predetermined filter coefficient, and for generating a product produced therefrom; and an accumulator means for accumulating the product produced from said multiplier means and for generating accumulated data as sequential output data synthesized from said two sequential input data.

6. The digital filter according to claim 5, further comprising a second memory means having a plurality of filter coefficients stored therein, said second memory means operating to produce an incrementally increasing filter coefficient to said multiplier means.

7. A digital filter comprising:

an adder/subtracter means for performing an addition and subtraction operation on two sequential input data, and for generating a result produced thereby;

a memory means for storing the result produced from said adder/subtracter means;

a multiplier means for multiplying the result produced from said adder/subtracter means, read from said memory means, by a predetermined filter coefficient, and for generating a product produced thereby;

an accumulator means for accumulating the product obtained from said multiplier means and for generating accumulated data as sequential output data synthesized from said two sequential input data;

a first selector means for selectively producing said sequential input data and said sequential output data from said accumulator means to said adder/subtracter means; and a second selector means for selectively producing one of several sequential input data corresponding to said sequential input data produced to said adder/subtracter means from said first selector means,, to said adder/subtracter means.

8. The digital filter according to claim 7, further comprising a third selector means for selectively producing the result produced from said adder/subtracter means and the sequential input data to said memory means, and a register means for storing said sequential input data read from said memory means whereby said sequential input data, read from said register means, is produced to one of said first selector means and said second selector means.

9. A digital filter comprising:

an adder/subtracter means for performing an addition and subtraction process on two sequential input data, and for generating a result produced thereby;

a memory means for storing the result produced by said adder/subtracter means;

a multiplier for multiplying said the result produced from said adder/subtracter means, read from said memory means, by a predetermined filter coefficient, and for generating a product produced thereby;

an accumulator means for accumulating the product produced by said multiplier means, and for generating accumulated data as sequential output data synthesized from said two sequential input data;

a first selector means for selectively producing said sequential input data and said sequential output data from said accumulator means to said adder/subtracter means;

a register means for storing said accumulated data generated from said accumulator means;

a second selector means for selectively producing said sequential input data and output data, read from said register means, to said adder/subtracter means.

10. The digital filter according to claim 9, further comprising a third selector means for selectively producing an operation result from said adder/subtracter means and sequential input data to said memory means, and a register means for storing said sequential input data read from said memory means, whereby said sequential input data, read from said register means, is output to one of said first selector means and said second selector means.

* * * * *